(12) United States Patent
Chun

(10) Patent No.: US 9,401,357 B2
(45) Date of Patent: Jul. 26, 2016

(54) DIRECTIONAL FINFET CAPACITOR STRUCTURES

(71) Applicant: QUALCOMM Incorporated, San Diego, CA (US)

(72) Inventor: Hong Chun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/498,322

(22) Filed: Sep. 26, 2014

(65) Prior Publication Data

US 2015/0249081 A1      Sep. 3, 2015

Related U.S. Application Data

(60) Provisional application No. 61/946,553, filed on Feb. 28, 2014, provisional application No. 61/946,628, filed on Feb. 28, 2014.

(51) Int. Cl.

| | |
|---|---|
| *H01L 27/06* | (2006.01) |
| *H01L 23/522* | (2006.01) |
| *H01L 49/02* | (2006.01) |
| *H01L 29/78* | (2006.01) |
| *H01L 27/08* | (2006.01) |

(52) U.S. Cl.
CPC ........ *H01L 27/0629* (2013.01); *H01L 23/5223* (2013.01); *H01L 27/0805* (2013.01); *H01L 28/60* (2013.01); *H01L 28/86* (2013.01); *H01L 29/785* (2013.01); *H01L 2924/0002* (2013.01)

(58) Field of Classification Search
CPC ................................................... H01L 27/0629
See application file for complete search history.

(56) References Cited

U.S. PATENT DOCUMENTS

| | | | |
|---|---|---|---|
| 6,117,725 | A  | 9/2000 | Huang |
| 6,847,077 | B2 | 1/2005 | Thomas et al. |
| 7,479,439 | B2 | 1/2009 | Coolbaugh et al. |
| 8,581,320 | B1 | 11/2013 | Cheng et al. |
| 2008/0173913 | A1 | 7/2008 | Kojima |
| 2008/0304205 | A1 | 12/2008 | Bang |
| 2010/0213520 | A1 | 8/2010 | Furuta et al. |
| 2013/0087886 | A1 | 4/2013 | Chen et al. |
| 2013/0113072 | A1 | 5/2013 | Liu et al. |
| 2013/0270620 | A1 | 10/2013 | Hu et al. |

OTHER PUBLICATIONS

International Search Report and Written Opinion—PCT/US2015/017975—ISA/EPO—Jun. 17, 2015.

*Primary Examiner* — Lex Malsawma
(74) *Attorney, Agent, or Firm* — Sayfarth Shaw LLP

(57) ABSTRACT

A method for fabricating a capacitor within a FinFET device includes patterning a first gate interconnect material having a first recess. The method also includes patterning a first trench interconnect material coupled to the first gate interconnect material at the first recess to form a first plate of a FinFET capacitive structure.

9 Claims, 23 Drawing Sheets

DIRECTIONAL FINFET CAPACITOR STRUCTURES

CROSS-REFERENCE TO RELATED APPLICATION

This application claims the benefit under 35 U.S.C. §119(e) to U.S. Provisional Patent Application No. 61/946,553, entitled "DIRECTIONAL FINFET CAPACITOR STRUCTURES," filed on Feb. 28, 2014, and U.S. Provisional Patent Application No. 61/946,628, entitled "FINFET CAPACITOR STRUCTURES," filed on Feb. 28, 2014, the disclosure disclosures of which are expressly incorporated by reference herein in their entireties.

BACKGROUND

1. Field

Aspects of the present disclosure relate to semiconductor devices, and more particularly to capacitor structures in field effect transistor (FET) structures using fin (FinFET) channels.

2. Background

FinFET structures have reduced the chip area of transistors in integrated circuits. The FinFET structure uses additional layers to connect to the source/drain contacts, and the gate contacts, of the FinFET devices. Spaces between the FinFET devices in an integrated circuit have also decreased. These spaces are often unused to allow for isolation between devices. Other structures, such as capacitors, still have large chip areas, which makes scaling of the entire integrated circuit more difficult. Capacitors are often made in the metal interconnection layers, and often fabricated in the layers above the "metal one" (M1) layer in circuits. These structures reduce some of the advantages of reduced size transistors in FinFET structures and devices.

SUMMARY

A method for fabricating a capacitor from middle of line (MOL) layers of a FinFET device includes patterning a first gate interconnect material having a first recess. The method also includes patterning a first trench interconnect material coupled to the first gate interconnect material at the first recess to form a first plate of a FinFET capacitive structure.

A capacitor including middle-of-line (MOL) layers of a FinFET device includes a first gate interconnect material having a first recess. The MOL layers further include a first stacked trench interconnect material coupled to the first gate interconnect material at the first recess to form a first plate of a FinFET capacitive structure. The MOL layers may also include a second gate interconnect material having a second recess. The MOL layers may also include a second stacked trench interconnect material coupled to the second gate interconnect material at the second recess to form a second plate of the FinFET capacitive structure.

A device including middle-of-line (MOL) layers in a FinFET device includes first means for interconnecting a first gate having a first recess. The device also includes first means for interconnecting a first trench coupled to the first gate interconnecting means at the first recess to form a first plate of a FinFET capacitive structure. The device may also include second means for interconnecting a second gate having a second recess. The device may also include second means for interconnecting a second trench coupled to the second gate interconnecting means at the second recess to form a second plate of the FinFET capacitive structure.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor fabrication processes are often divided into three parts: a front end of line (FEOL), a middle of line (MOL) and a back end of line (BEOL). Front end of line processes include wafer preparation, isolation, well formation, gate patterning, spacers, and dopant implantation. A middle of line process includes gate and terminal contact formation. The gate and terminal contact formation of the middle of line process, however, is an increasingly challenging part of the fabrication flow, particularly for lithography patterning. Back end of line processes include forming interconnects and dielectric layers for coupling to the FEOL devices. These interconnects may be fabricated with a dual damascene process using plasma-enhanced chemical vapor deposition (PECVD) deposited interlayer dielectric (ILD) materials.

More recently, the number of interconnect levels for circuitry has substantially increased due to the large number of transistors that are now interconnected in a modern microprocessor. The increased number of interconnect levels for supporting the increase number of transistors involves more intricate middle of line processes to perform the gate and terminal contact formation.

As described herein, the middle of line interconnect layers may refer to the conductive interconnects for connecting a first conductive layer (e.g., metal one (M1)) to the oxide diffusion (OD) layer of an integrated circuit as well for connecting M1 to the active devices of the integrated circuit. The middle of line interconnect layers for connecting M1 to the OD layer of an integrated circuit may be referred to as "MD1" and "MD2." The middle of line interconnect layer for connecting M1 to the poly gates of an integrated circuit may be referred to as "MP."

Figure 1:
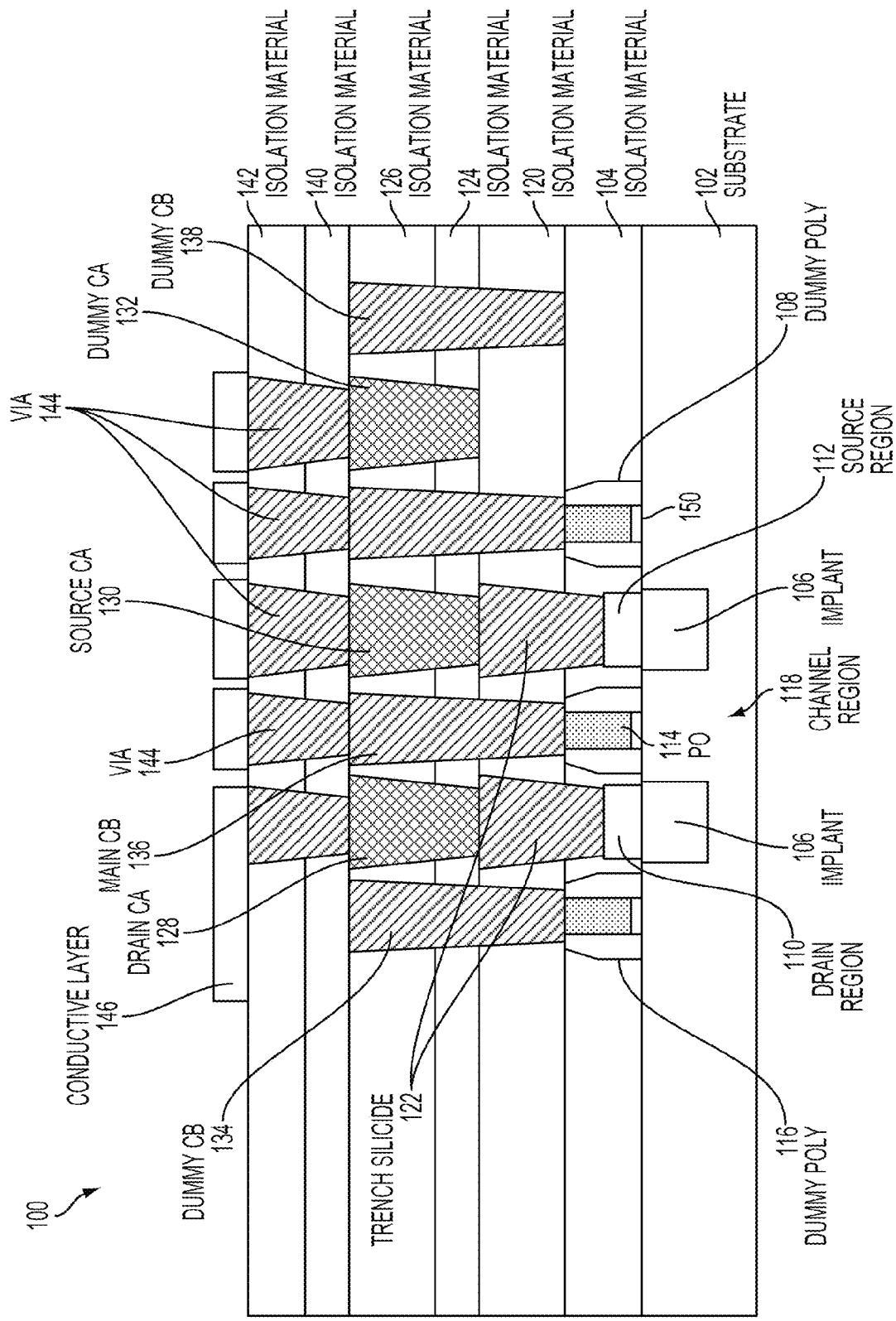
FIG. 1 shows a cross-sectional view illustrating an integrated circuit (IC) device including a FinFET structure.

FIG. 1 shows a cross-sectional view illustrating an integrated circuit (IC) device including a FinFET structure. The IC device 100 includes a semiconductor substrate (e.g., a silicon wafer) 102 having shallow trench isolation (STI) regions within an isolation material 104. Within the substrate 102 are implant regions 106, and within the isolation material 104 are a poly spacer 150, a drain region 110, a source region 112, a main poly 114 (PO), and a dummy poly region 116. A channel region 118 (or around main poly 114) lies between the implant regions 106, and by controlling voltage on the main poly 114, the drain region 110 and the source region 112, the channel region 118 selectively conducts electrical current.

Another layer of isolation material 120, which may be a similar material to the isolation material 104, and may be a layer of silicon dioxide or other material, is coupled to the isolation material 104. The isolation material 120 is patterned to expose the drain region 110 and source region 112, and the exposed regions of the isolation material 120 are filled with a trench silicide 122 or other conductive material. The trench silicide 122 trenches are often considered as a first MOL interconnect layer, and may be referred to as a set of active (oxide diffusion (OD)) contacts or metal diffusion (MD1) contacts. The first MOL conductive layer may comprise tungsten, copper, or other like conductive material.

Although the dummy poly region 108, the main poly 114, and the dummy poly region 116 are referred to as "poly," and may be made of polysilicon, these regions may be made from other materials that allow for similar electrical connections as polysilicon without departing from the scope of the present disclosure. Further, the dummy poly region 108, the main poly 114, and the dummy poly region 116 may include other structures or materials, such as silicon dioxide, without departing from the scope of the present disclosure.

In FIG. 1, an isolation material 124 and an isolation material 126 are formed on the isolation material 120. The isolation material 120, the isolation material 124, and the isolation material 126 are selectively patterned to provide for several connections to the dummy poly region 108, trench silicide 122, main poly 114, and dummy poly region 116. The trench interconnect 128, which may be referred to as a drain trench interconnect or "drain CA trench," is coupled to the trench silicide 122 coupled to the drain region 110. Similarly, a trench interconnect 130, which may be referred to as a source trench interconnect or "source CA trench," is coupled to the trench silicide 122 coupled to the source region 112. A trench interconnect 132, which may be referred to as a dummy trench interconnect or "dummy CA trench," is coupled to the isolation material 120. The drain CA trench interconnect 128, the source CA trench interconnect 130, and the dummy CA trench interconnect 132 may be referred to as metal diffusion (MD2) contacts, trench interconnects, or CA interconnects.

A gate interconnect 134, which may be referred to as a dummy gate interconnect or "dummy CB," is coupled to the dummy poly region 116. Similarly, a gate interconnect 136, which may be referred to as a main gate interconnect or "main CB," is coupled to the main poly 114. A gate interconnect 138, which may be referred to as a dummy gate interconnect or "dummy CB," is not coupled to any poly layer. The gate interconnects (e.g., 134-138) may be referred to as metal-to-poly (MP) gate contacts, gate interconnects, or CB interconnects.

Figure 2:
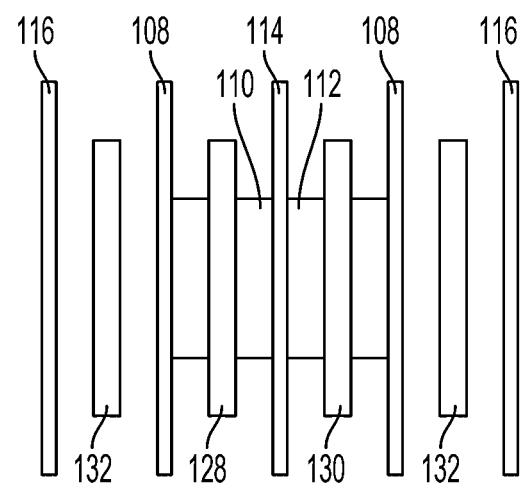
FIG. 2 illustrates a top view of a device as shown in FIG. 1.

An isolation layer 140 and an isolation layer 142 are coupled to the isolation material 126. The isolation layer 140 and the isolation layer 142 are selectively patterned to create openings exposing the gate interconnect 134 (dummy CB), the drain CA trench interconnect 128, the gate interconnect 136 (main CB), the source CA trench interconnect 130, the trench interconnect 132 (dummy CA), and the gate interconnect 138 (dummy CB). These openings are filled with a conductive material to form vias 144, which are usually referred to as a via zero (e.g., "V0") layer of material. Another conductive layer 146, which is usually referred to as the "metal one" or "M1" layer, is coupled to vias 144 to allow for selective electrical coupling to the structures in the IC device 100. FIG. 2 illustrates a top view of a device as shown in FIG. 1, and illustrates that the source region 112 and the drain region 110 extend underneath the dummy poly region 108. The edge of the source region 112 and the drain region 110 may extend to the center of the dummy poly region 108.

In some integrated circuit designs, capacitive devices may be fabricated using conductive layer 146, and other layers that are farther away from substrate 102. In one aspect of the present disclosure, capacitive devices may be fabricated with the trench interconnects (e.g., 132-138). The trench interconnects (e.g., 132-138) may not employ a poly layer underneath as shown in FIG. 1. Further, the trench interconnects (e.g., 132-138) may not be coupled to the drain region 110, the source region 112 or the poly regions (e.g., main poly 114, and dummy poly region 116) such as the trench interconnect 132. Further, the trench interconnects (e.g., 128-138), which may be unique to FinFET designs, are overlapped in one or more aspects of the present disclosure. This overlapping of the trench interconnects (e.g., 128-138) to form a capacitor structure may increase the capacitance per unit area (e.g., capacitor density) of the IC device 100.

Although shown as separate layers and/or volumes in FIG. 1, many of the interconnects may be fabricated as a single layer or as a single trench within the IC device 100. For example, and not by way of limitation, the main poly 114 and the half height of gate interconnect 136 (e.g., main CB) may be fabricated as a single structure. Further, the gate interconnect 136 (e.g., main CB) and the via 144 coupled to the gate interconnect 136 (e.g., main CB) may be fabricated as a single structure. Also, the trench silicide 122 and the drain CA (e.g., trench interconnect 128), and/or the trench silicide 122 and the trench interconnect 130 (e.g., source CB), may be fabricated as a single structure. Further, The trench interconnect 128 (drain CA) or the trench interconnect 130 (source CA) can be combined with via 144 as a single structure. The present disclosure is not limited to the structures shown in FIG. 1.

Figure 3A:
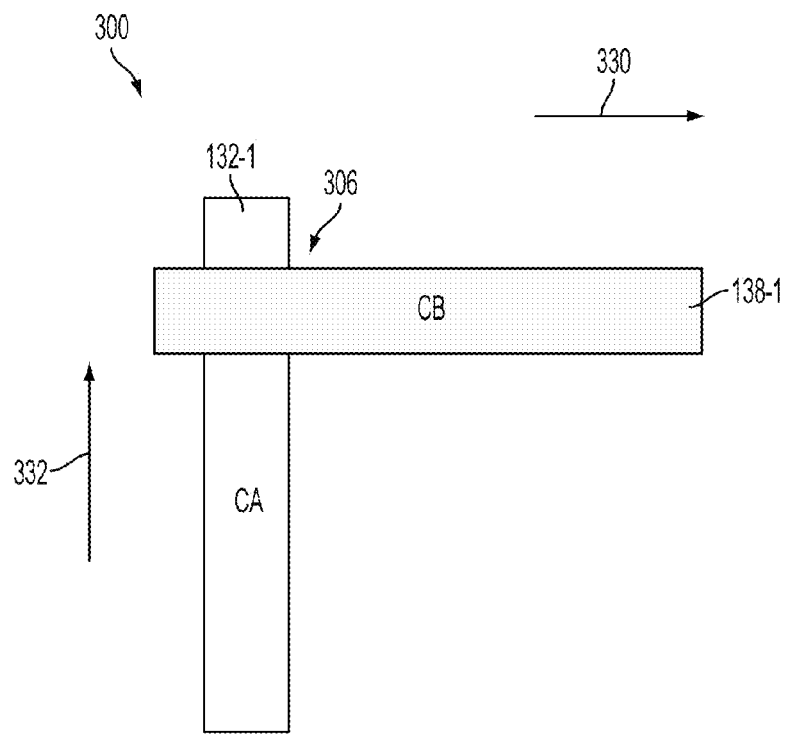
FIGS. 3A-3D illustrate views of capacitive layers and shapes in accordance with an aspect of the present disclosure.

FIGS. 3A-3D illustrates views of a capacitive device in accordance with an aspect of the present disclosure. FIG. 3A illustrates a top view of a capacitive device in accordance with aspects of the present disclosure. A device 300 comprises a first CA trench interconnect (e.g., dummy CA trench interconnect) 132-1 which may be patterned in a first direction 330. A first gate interconnect 138-1 may be patterned in a second direction 332. The first direction 330 and the second direction 332 may be perpendicular to each other if desired. The first direction 330 and the second direction 332 may also be specified to be in specific directions based on foundry specifications, design rules, or other design limitations of the device 300. For example, and not by way of limitation, the trench interconnect 132 (dummy CA) may be allowed in a certain direction because of foundry requests or limitations, and the gate interconnect 138 (dummy CB) may only be allowed in a horizontal direction because of foundry requests or limitations. One aspect of the present disclosure, however, allows the trench interconnect 132 (e.g., CA) and the gate interconnect 138 to overlap each other so that CA and CB interconnects can be arranged as a capacitor. In FIG. 3A, the top view illustrates a distinct shape in the overlapping of the CA and CB interconnects, which may be rounded at the overlapping portion or arranged in any other like shape.

Figure 3B:
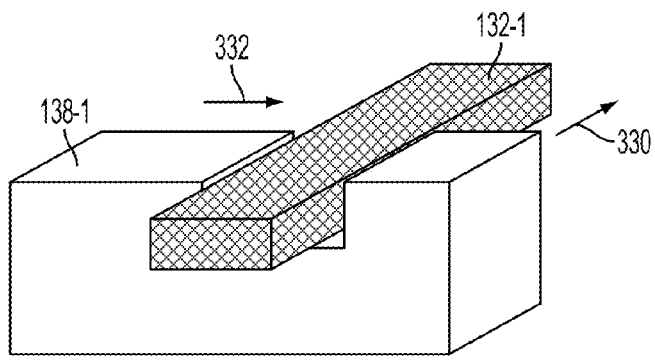
Figure 3C:
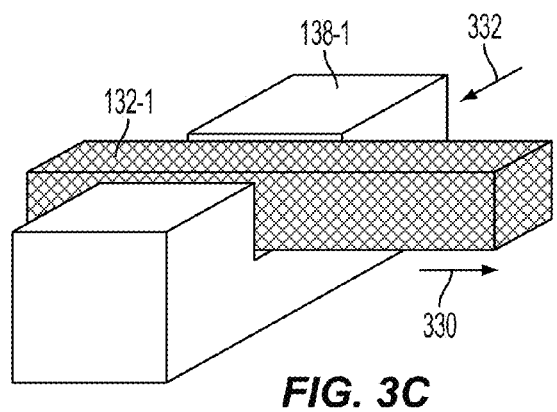

Perspective views of the overlap of the first gate interconnect 138-1 (first dummy CB) and the first trench interconnect 132-1 (first dummy CA) are shown in FIGS. 3B and 3C. The width of the first gate interconnect 138-1 may be narrower, wider, or the same width as the first trench interconnect 132-1. A space is shown between the first gate interconnect 138-1 and the first trench interconnect 132-1 in FIG. 3B. The space shown may illustrate the different elements; the first trench interconnect 132-1 and the first gate interconnect 138-1 are electrically and/or mechanically coupled. The first trench interconnect 132-1 and the first gate interconnect 138-1 may be used as a plate of a capacitor or a capacitive device in an aspect of the present disclosure. By overlapping the first trench interconnect 132-1 and the first gate interconnect 138-1, the capacitor density in a semiconductor device may be increased, instead of implementing capacitor structures in the conductive layer 146 or only one of the first trench interconnect 132-1 and the first gate interconnect 138-1 individually.

Figure 3D:
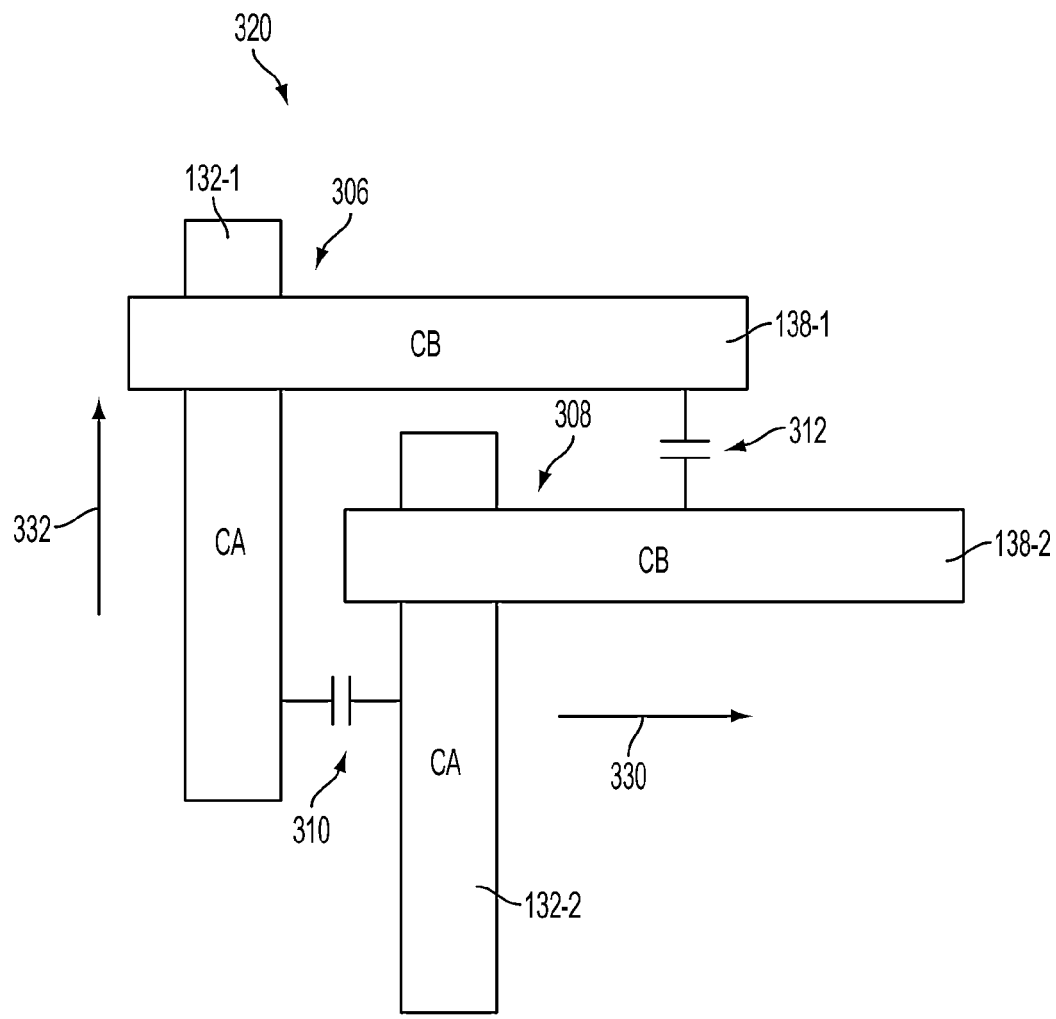

FIG. 3D illustrates a top view of a capacitor device 320 in accordance with an aspect of the present disclosure. A capacitor device 310 comprises a first trench interconnect 132-1 (first dummy CA) and a second trench interconnect 132-2 (second dummy CA), which may be patterned in a first direction 330. A first gate interconnect 138-1 (first dummy CB) and a second gate interconnect 138-2 (first dummy CB) may be patterned in a second direction 332. The first direction 330 and the second direction 332 may be perpendicular to each other if desired. The first direction 330 and the second direction 332 may also be specified to be in specific directions based on foundry specifications, design rules, or other design limitations of the capacitor device 320.

For example, and not by way of limitation, the trench interconnect 132 (e.g., dummy CA) may be allowed in a certain direction because of foundry requests or limitations. Conversely, the gate interconnect 138 (dummy CB) may only be allowed in a horizontal direction because of foundry requests or limitations. One aspect of the present disclosure, however, allows the trench interconnect 132 (CA) and the gate interconnect 138 to be in any direction, and take any shape, as desired. For example, and not by way of limitation, the area where the first dummy CA trench interconnect 132-1 and the first gate interconnect 138-1 overlap may be rounded or irregular in shape without departing from the scope of the present disclosure.

An overlap region 306 between the first dummy CA trench interconnect 132-1 and the first gate interconnect 138-1 forms an electrical connection at the overlap region 306. The electrical connection at the overlap region 306 is created without a via or other interlayer electrical connection, as the overlap region provides a common surface area or recess for the first dummy CA trench interconnect 132-1 and the first gate interconnect 138-1 for mechanical and electrical connections.

Similarly, an overlap region 308 creates a second electrical connection between the second dummy CA trench interconnect 132-2 and the second gate interconnect 138-2. The first dummy CA trench interconnect 132-1 and the first gate interconnect 138-1 form one plate of a capacitor. In addition, the second dummy CA trench interconnect 132-2 and the second gate interconnect 138-2 form another plate of the capacitor. The capacitance between the first dummy CA trench interconnect 132-1 and the second dummy CA trench interconnect 132-2 is illustrated as the capacitor device 310. The capacitance between the first gate interconnect 138-1 and the second gate interconnect 138-2 is shown as capacitor 312. The total capacitance of the capacitor device 310 is a combination of the capacitor device 310 and the capacitor 312.

Because the trench interconnect 132 and the gate interconnect 138 can be electrically connected without a via or other interconnection, the capacitor structure in this aspect of the present disclosure is easier to manufacture than previous capacitor structures made in other layers. Further, the trench interconnect 132 and the gate interconnect 138 can be fabricated in chip areas that previously did not contain any devices, which may increase the capacitor density per unit area of an integrated circuit.

Striped Capacitor Structure

Figure 4:
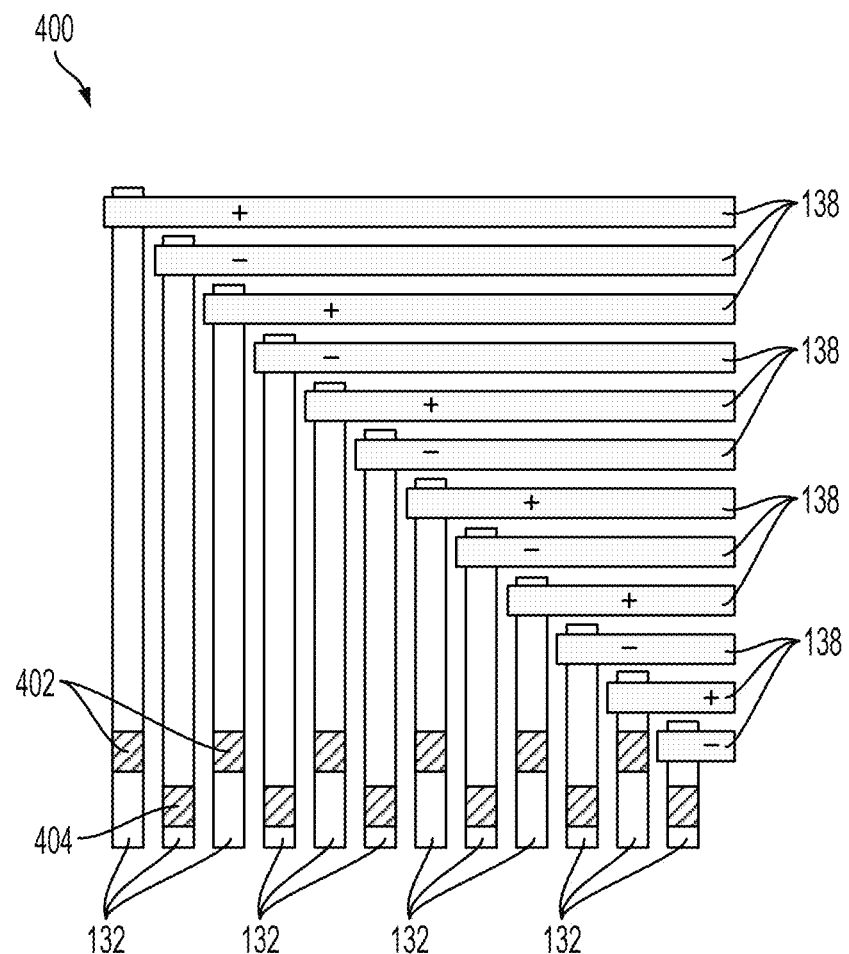
FIG. 4 illustrates a capacitor structure in accordance with an aspect of the present disclosure.

FIG. 4 illustrates a capacitor structure in accordance with an aspect of the present disclosure. As shown in FIG. 4, multiple ones of the trench interconnect 132 and gate interconnect 138 are arranged in a device 400. The Vias 402 couple one polarity (e.g., the positive polarity) of the device 400 to the conductive interconnect layers (e.g., metal one (M1)). Another group of vias 404 couple the other polarity (e.g., the negative polarity) to the conductive layers. The structure of the device 400 may be referred to as a "zebra" structure, an array of stripes, and/or array of striped structures. Although shown in a particular pattern in FIG. 4, the vias 402 and 404 may be connected to any portion of the device 400. Further, the vias 402 and 404 may be connected together in other layers of the device 400 to couple the "stripes" together.

Figure 5:
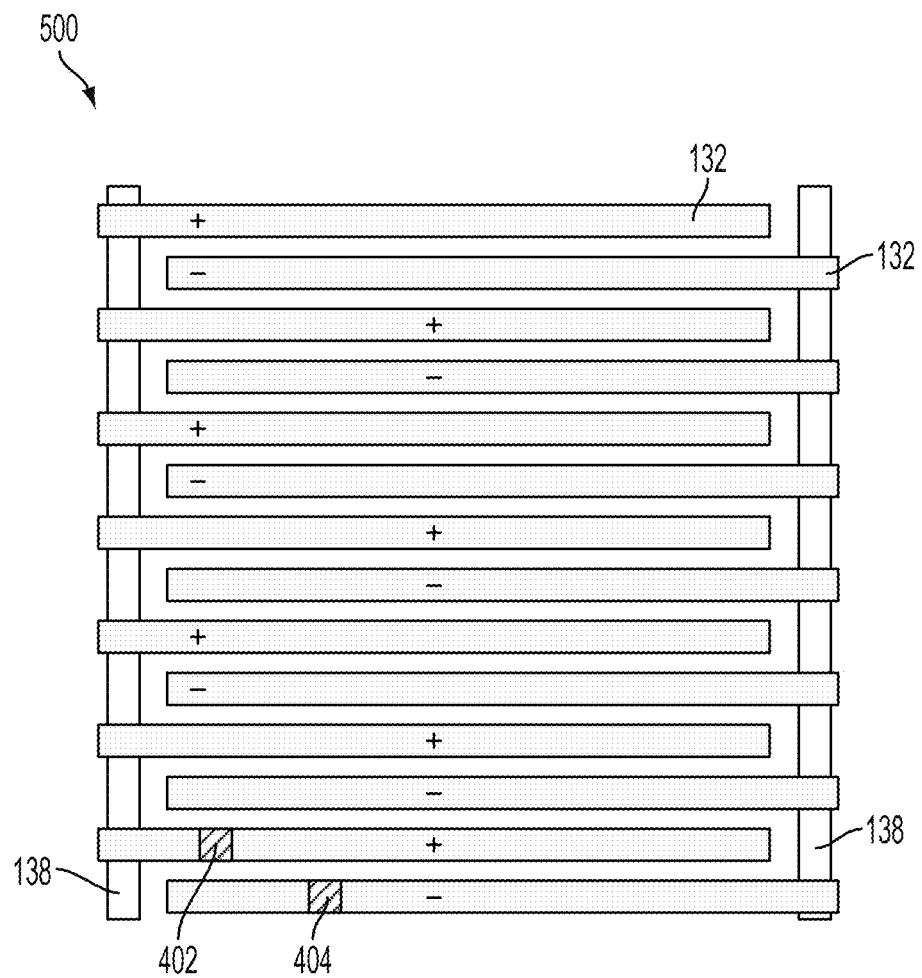
FIG. 5 illustrates a capacitor structure in accordance with another aspect of the present disclosure.

FIG. 5 illustrates a capacitor structure in accordance with another aspect of the present disclosure. As shown in FIG. 5, two of the floating drain or source trench interconnects (CA) 138 and a series of the gate interconnects (CB) 132 are placed in the device 500. Multiple ones of trench interconnect 132 create "fingers" of alternating polarity between multiple ones of the gate interconnect 138. The via 402 couples one polarity (e.g., the positive polarity) of the device 400 to the conductive interconnect layers (e.g., metal one (M1)). Another via 404 couples the other polarity (e.g., the negative polarity) to the conductive layers. The structure of the device 400 may be referred to as another "zebra" structure, an array of stripes, and/or array of striped structures. Although shown in particular locations in FIG. 5, the vias 402 and 404 may be connected to any portion of the device 500. Further, the vias 402 and 404 may be connected together in other layers of the device 500 to couple the "fingers" together.

Ring Capacitor Structures

Figure 6A:
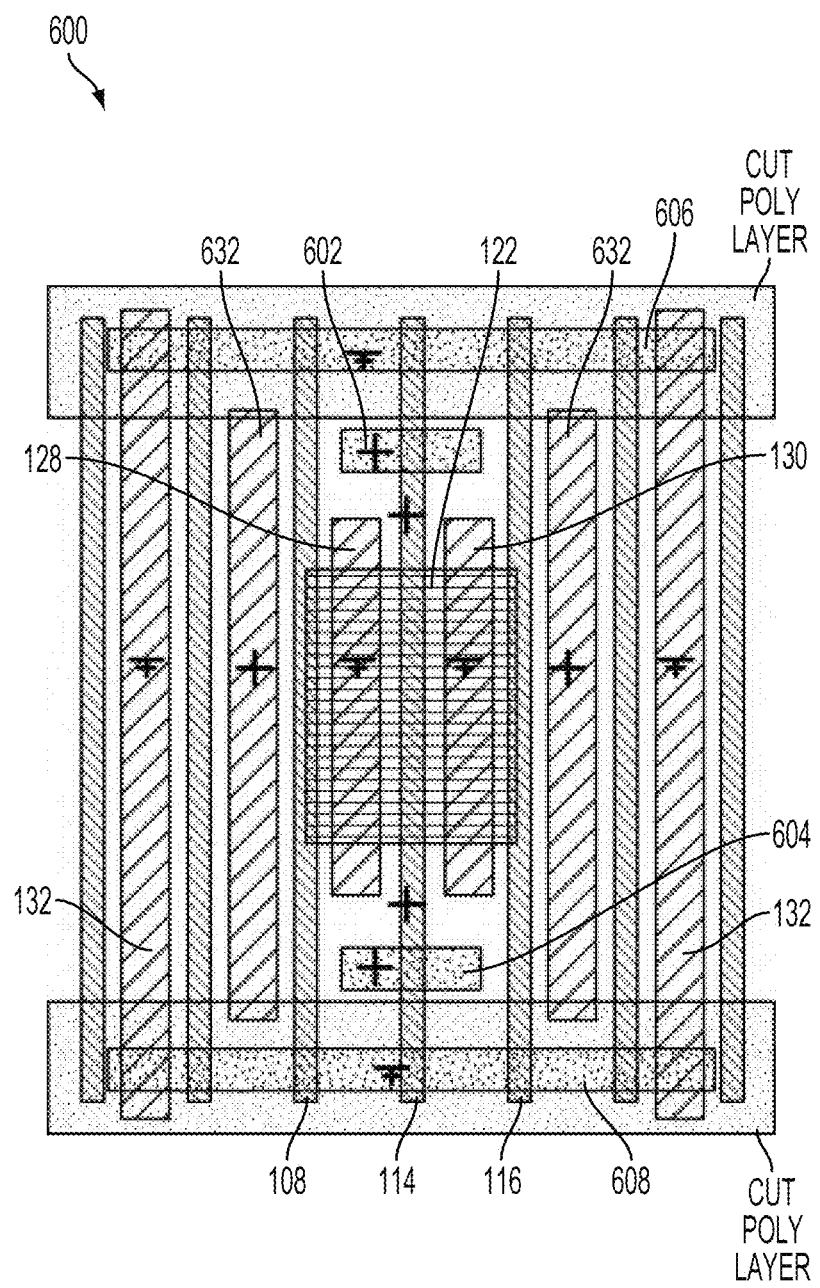
FIGS. 6A-6C illustrate a capacitor structure in accordance with further aspects of the present disclosure in single devices and array placements.
Figure 6B:
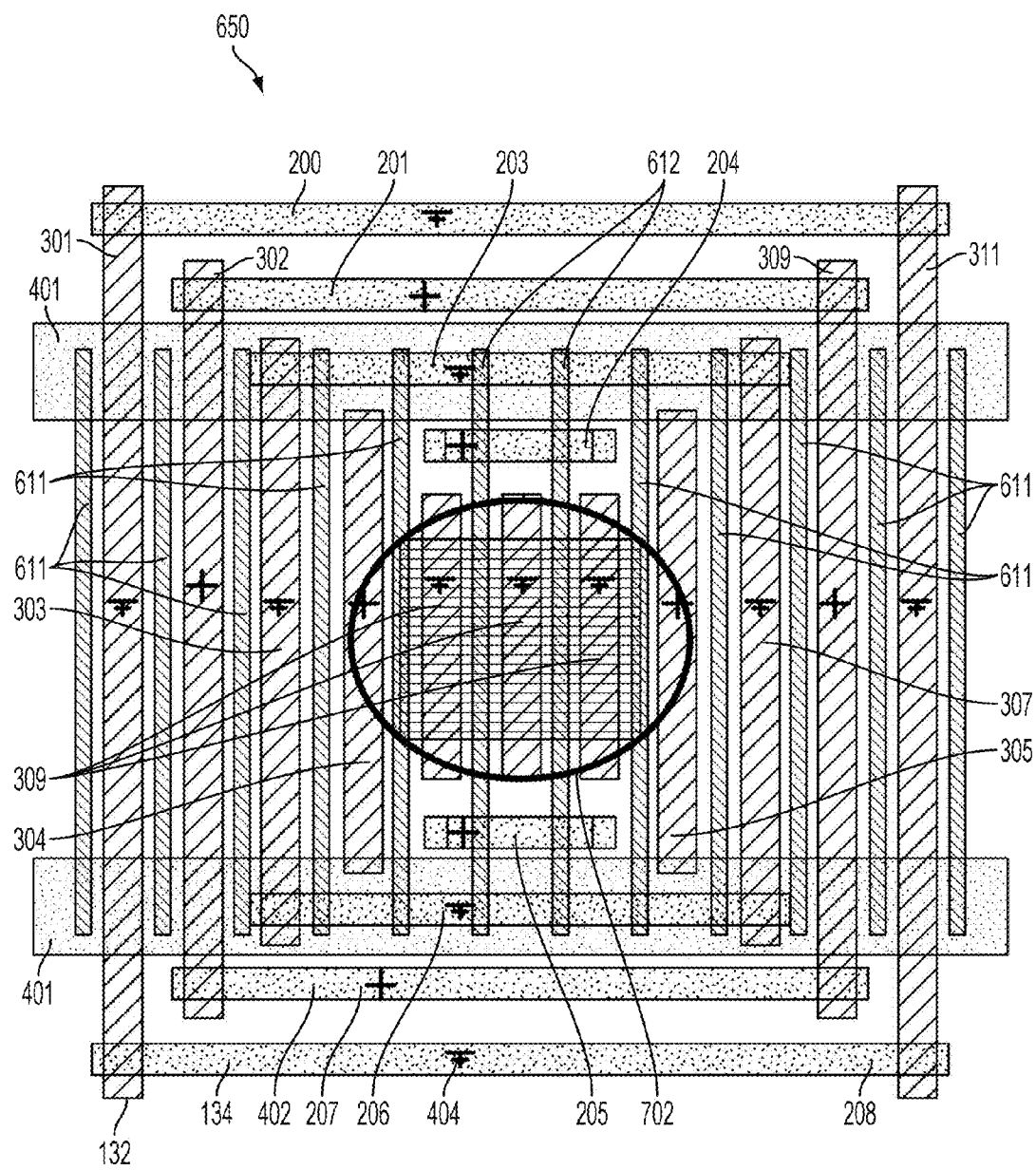
Figure 6C:
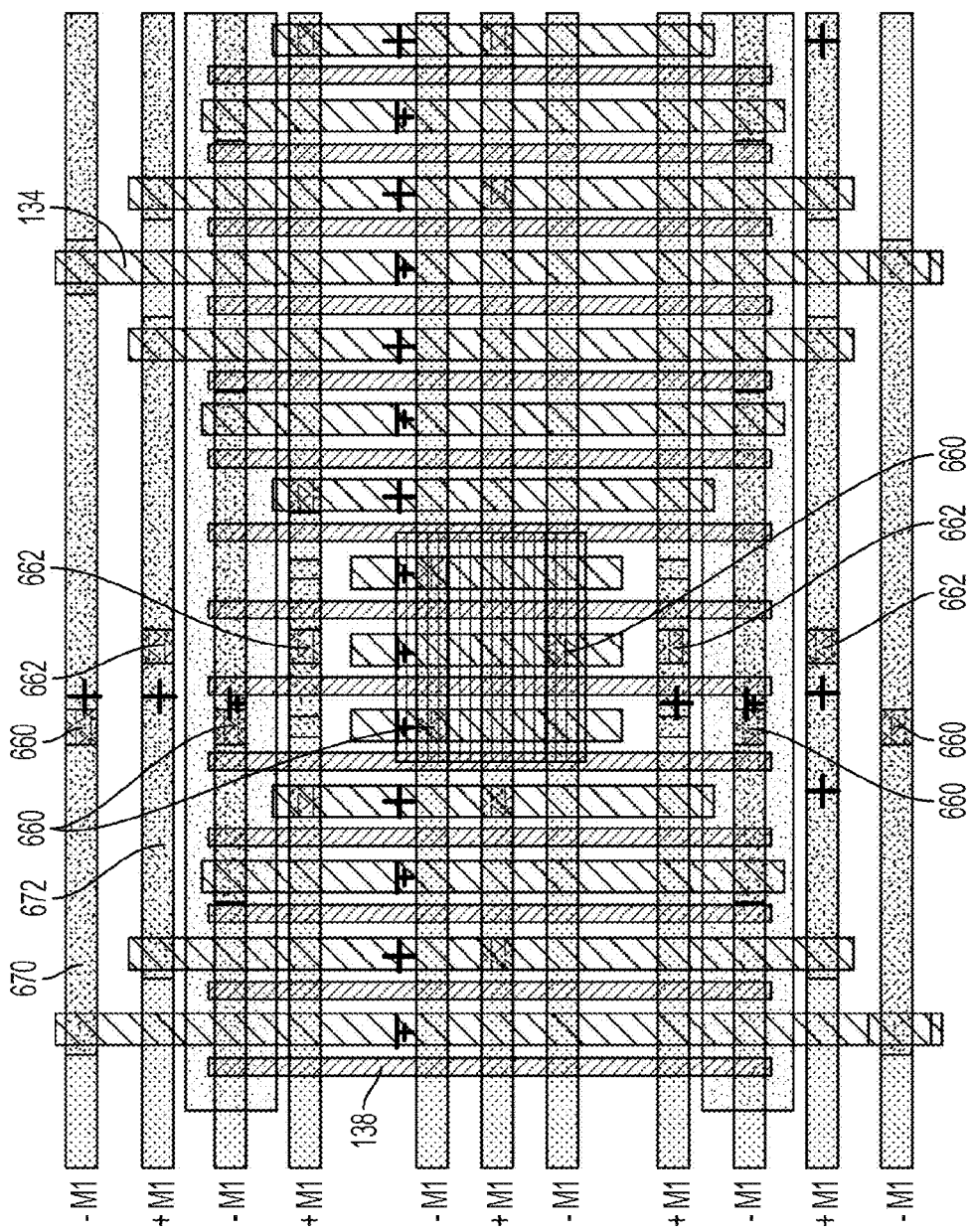

FIGS. 6A to 6C illustrate a capacitor structure in accordance with another aspect of the present disclosure. A capacitor 600 is arranged in a "donut" or ring structure of the interconnects described with respect to FIGS. 1-5. The CB interconnects 602 and 604 couple to one plate of the capacitor through upper layers (e.g., vias 402 and/or 404), and the CB interconnects 606 and 608 couple the trench interconnect 132 (dummy CA). The trench interconnect 128 and the trench interconnect 130 (source/drain CA) are used as one plate or polarity of the capacitor 600, which may be the negative plate of the capacitor 600, because trench interconnects (e.g., trench interconnect 128 and trench interconnect 130 (source/drain CA)) are proximate the trench silicide 122. The connection of CB interconnects 602, 604 to the main poly 114 (PO) creates another polarity, which may be the positive polarity, of the capacitor 600. The outer "ring" or donut of the capacitor 600 is the connection of CB interconnects 606, 608, and trench interconnect 132 (dummy CA). In this arrangement, the CB interconnects 602 and 604 do not overlap with dummy CA interconnects 632. In addition, the CB interconnects 606, 608 are coupled to the dummy poly region 108 and the dummy poly region 116.

In FIG. 6B, a capacitor structure 650 illustrates a donut or ring structure in accordance with an aspect of the present disclosure. A first layer of gate interconnect 134, shown as region 203 and region 206, and a first layer of trench interconnect 132, shown as region 303 and region 307, are formed around a MOS device 702 (circled). This may form one capacitor terminal of the capacitor structure 650. A second layer of trench interconnect 132, shown as region 201 and region 207, and a second layer of gate interconnect, shown as region 302 and region 309 are the other capacitor terminal. A third layer of gate interconnect 138, shown as region 200 and region 208 and a third layer of gate interconnect 134, shown as region 301 and region 311, act as another plate of the first capacitor terminal. The gate interconnect regions 204 and 205 form a positive or negative terminal connected to the poly gate. The gate interconnect regions 204 and 205 are connected to the trench interconnect regions 304 and 305 by another conductive layer (e.g., the metal one (M1) layer), through a via. The main poly 114 is a floating terminal 611. The real poly gate 612 acts as positive or negative terminal. If the gate interconnect regions 204 and/or 205 act as a positive terminal then the first layer of regions (e.g., 203, 206, 303, and 306) act as an opposing terminal of the gate interconnect regions 204 and 205. So the first, second, and third layers of the ring structure are opposite polarities to each other.

FIG. 6C also shows how the first layer of the ring structure (e.g., CP 203/206 and CA 303/306), the second layer of the ring structure, and the third layer of the ring structure of FIG. 6B are connected by another conductive layer 670 (e.g., M1) through vias 660 or a vias 662. The vias 660 connect to one terminal of the capacitor and the vias 662 connect to the other terminal of the capacitor. The other conductive layer 672 may thus connect to the positive terminal and negative terminal of the capacitor alternatively.

Vertical Capacitor Structures

Figure 7B:
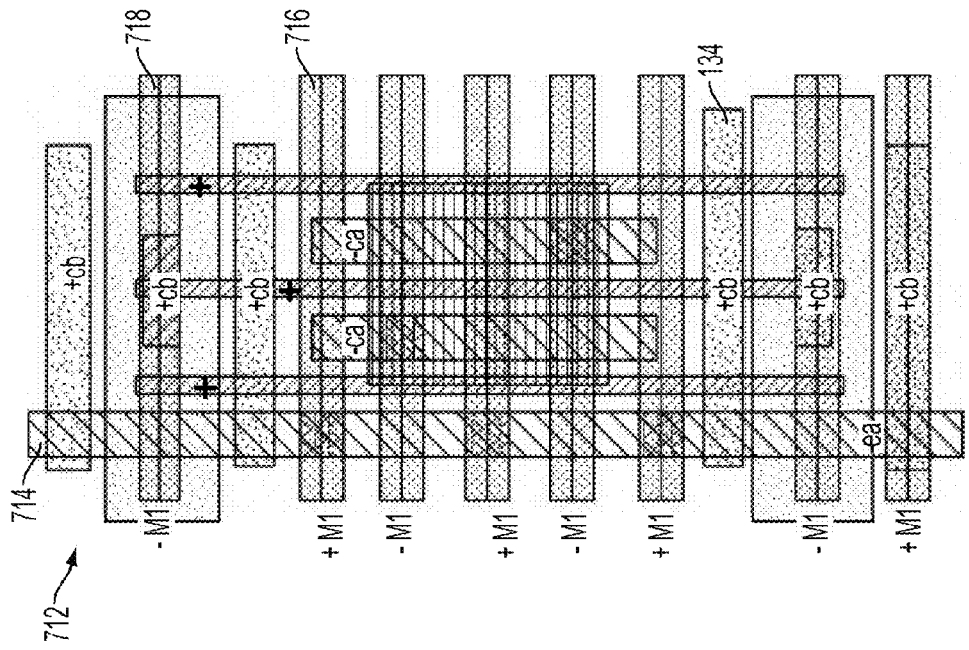
FIGS. 7A-7H illustrate capacitor structures in accordance with aspects of the present disclosure.
Figure 7A:
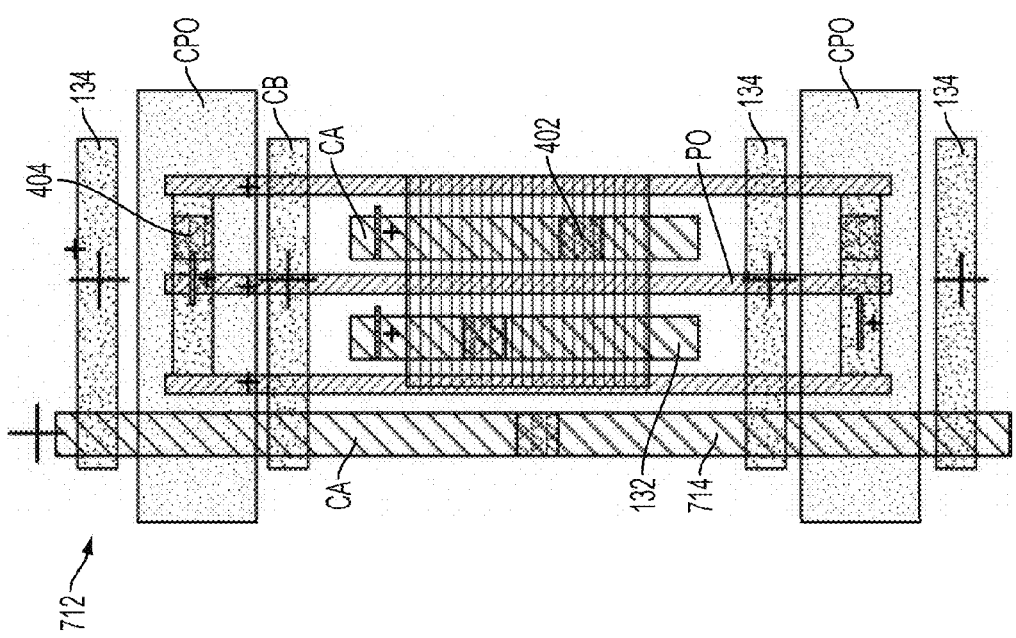

FIG. 7A illustrates a capacitor structure 712, where a trunk 714, which may be the trench interconnect 132, connects to some of the gate interconnects using vias 402 and/or 404. In one configuration, the trunk 714 may be of a positive polarity or plate of the capacitor structure 712. Another trunk 714 may be added to the capacitor structure 712, as desired, to surround the active area of the device, which would be a similar structure to those shown in FIG. 6A. Such a structure may be referred to as a vertical capacitor. Further, the capacitor structure 712 may be changed in size, or "stretched" to add to the capacitance of the capacitor structure 712. Although shown in a vertical configuration, the capacitor structure 712 may be formed or fabricated in a "horizontal" configuration or other orientations depending on the layers used within the capacitor structure 712.

FIG. 7B illustrates multiple ones of the gate interconnect 134 coupled to the trunk 714 and creating one plate of the capacitor structure 712 are coupled together with vias 404, which are then coupled to a conductive structure 716. The conductive structure 716 may be in the conductive layer 146, which may be the first conductive interconnect (e.g. metal one (M1)) layer of the device. The gate interconnects that are not coupled to the trunk 714, and create the other plate of the capacitor structure 712, are coupled together with vias 402, which are then coupled to one or more conductive structures. The conductive structure 716 and the conductive structure 718 are then accessed to charge and discharge the capacitor structure 712.

In some aspects of the present disclosure, it may be desirable to only grow in either the horizontal or vertical direction, but not both directions because of a particular area restriction. The capacitor structure 704 and the capacitor structure 712 may be used in areas of an integrated circuit where surrounding the active area of the device may not be possible or desirable, but capacitance is still be specified.

Figure 7C:
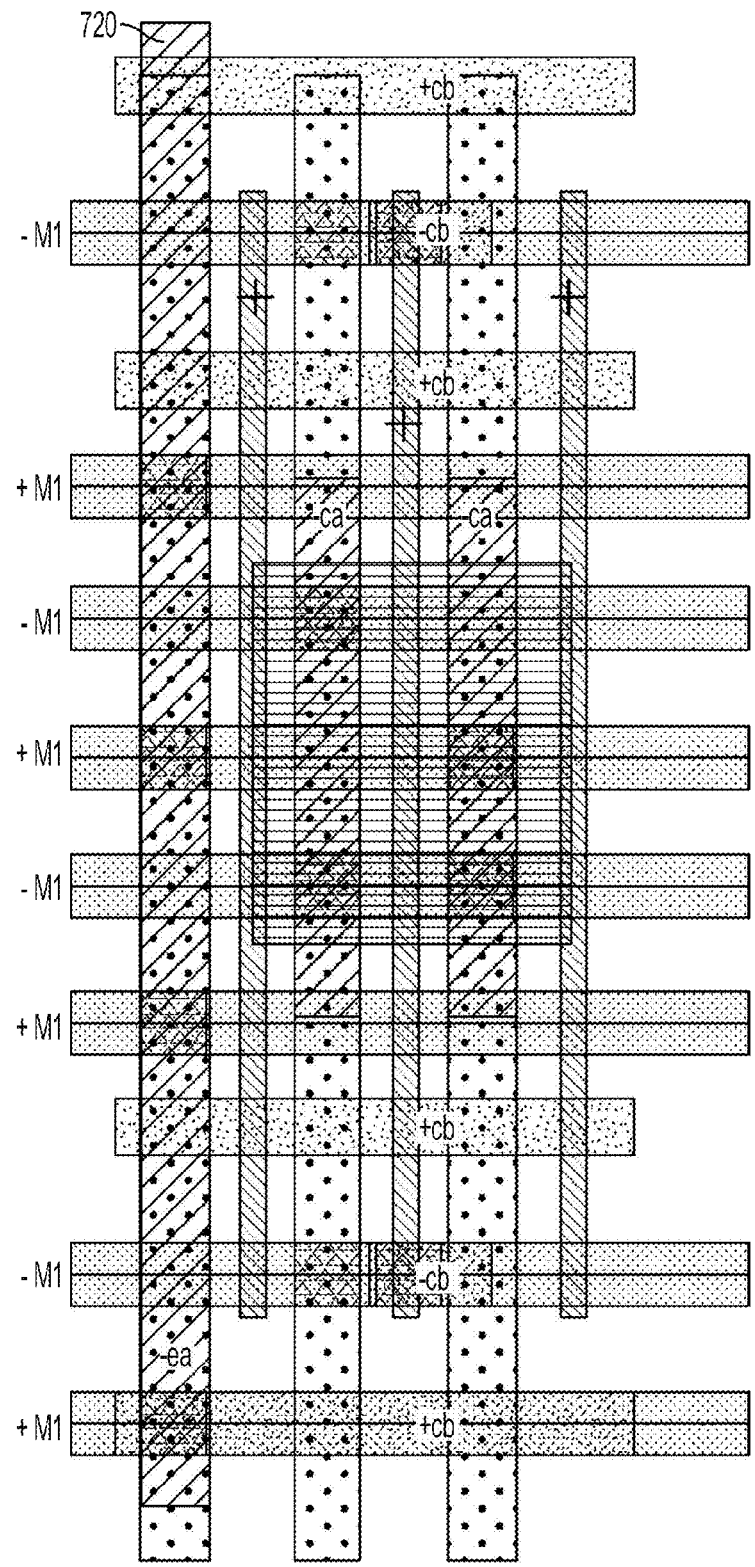
Figure 7D:
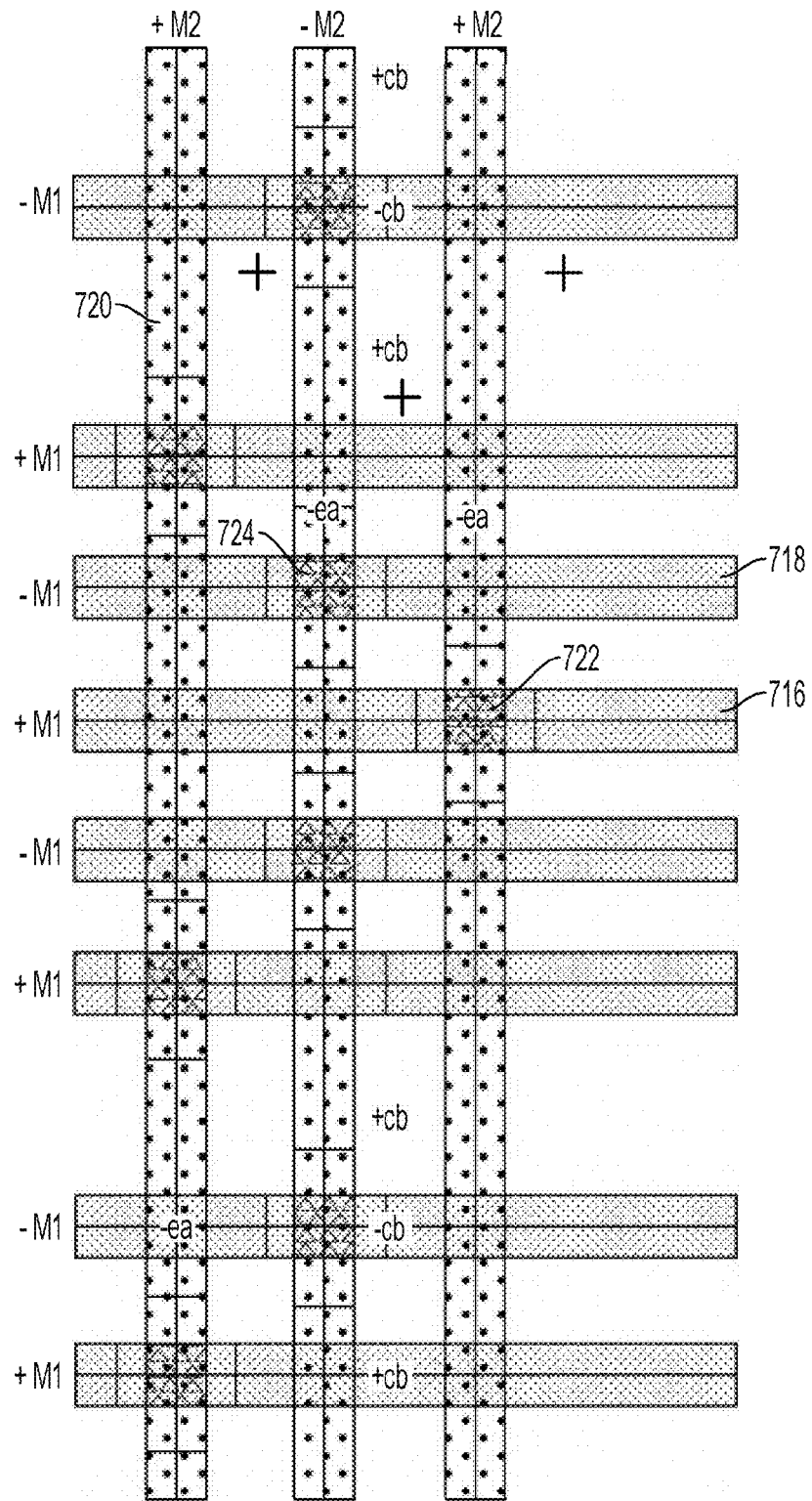

FIG. 7C illustrates a second conductive structure 720, which may be a second conductive interconnect layer (e.g., metal two (M2)), coupled to the conductive structure 716 and the conductive structure 718. The second conductive structure 720 may be coupled to the structure in a different direction than the conductive structure 718. FIG. 7D illustrates that the conductive structure 716 is coupled to the second conductive structure at vias 722, and that the conductive structure 718 is coupled to the second conductive structure at vias 724.

Encompassing Capacitor Structures

Figure 7E:
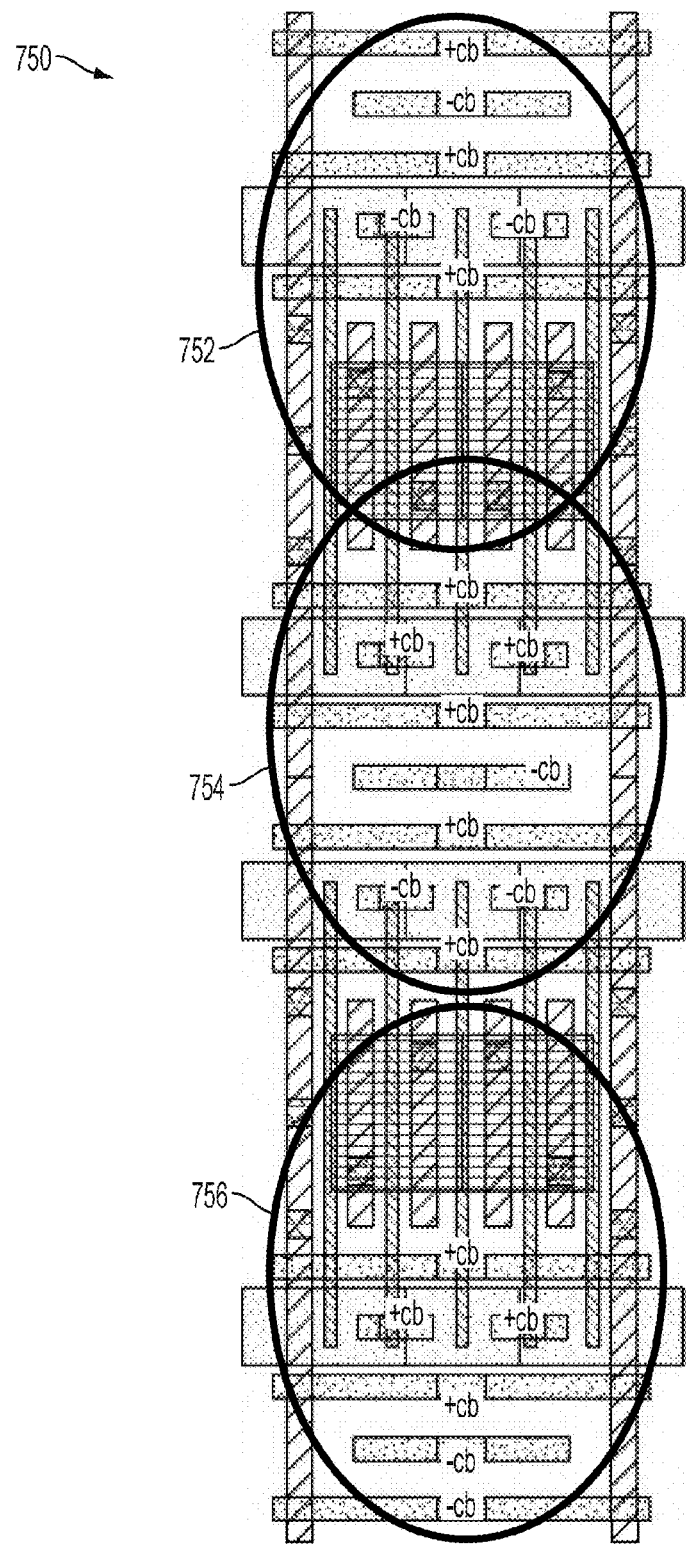

FIG. 7E illustrates an array of capacitive structures in accordance with an aspect of the present disclosure. The device 750 has three inset areas 752-756. Each of the inset areas 752-756 may form a separate capacitive structure. The inset areas 752-756 may be connected in series, in parallel, or may stand alone as individual capacitive structures. Further, the inset areas 752-756 may act as capacitive structures for the device 750, or for other devices coupled to the device 750.

Figure 7F:
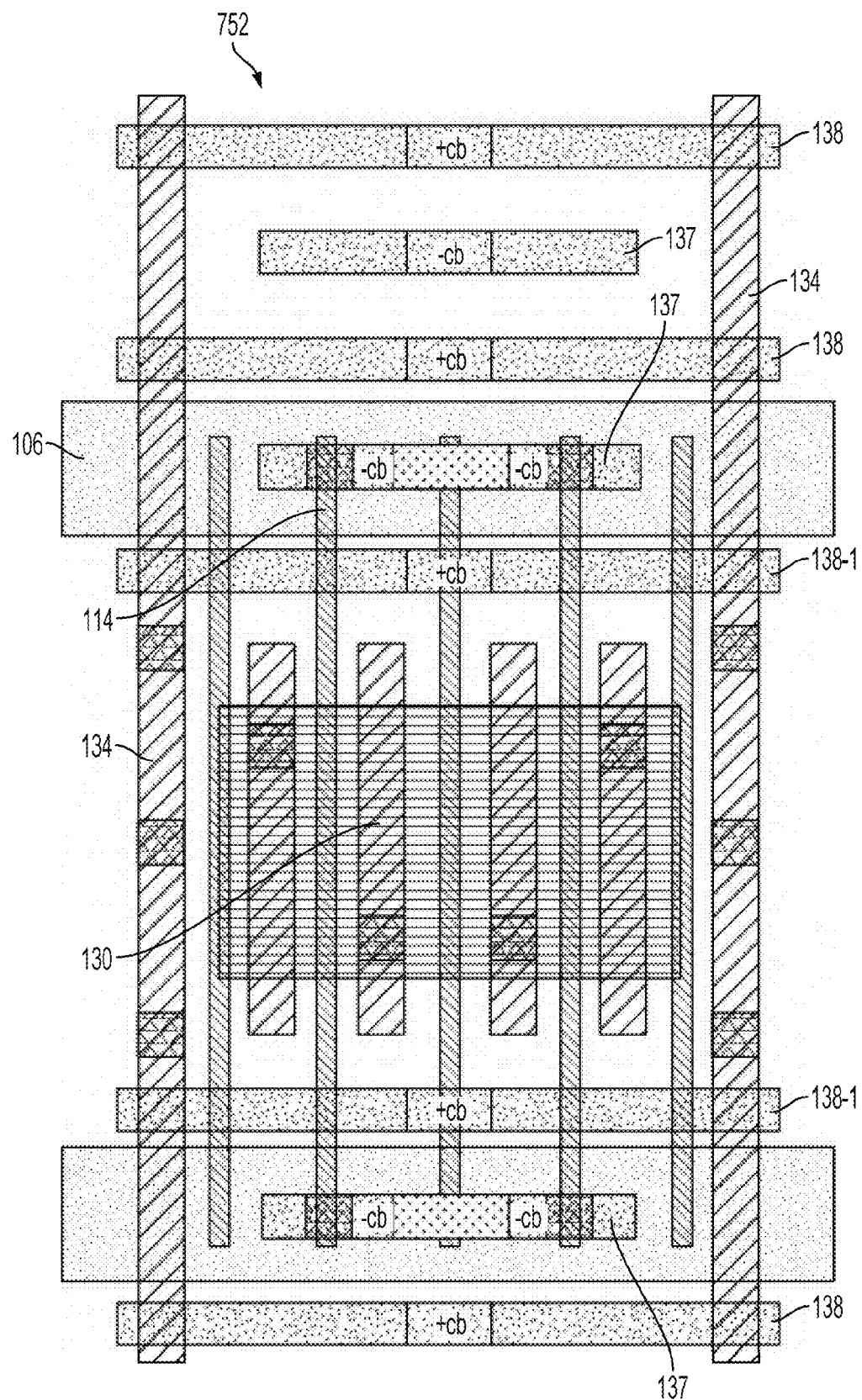

FIG. 7F is a close-up view of one of the inset areas 752. In FIG. 7F, the trench interconnect 132 is coupled to the gate interconnect 138/138-1, which may be a positive plate, of a capacitive structure. Multiple ones of the main poly 114 are coupled to gate interconnect 138-1. The other plate of the capacitive structure is formed by trench interconnect 137 (CB). Further, the gate interconnect 138 surrounds or encompasses one or more of the other gate interconnects (e.g., 137). This allows for additional capacitance, and also provides additional separate capacitive structures within an array of devices on a particular circuit if desired.

Figure 7G:
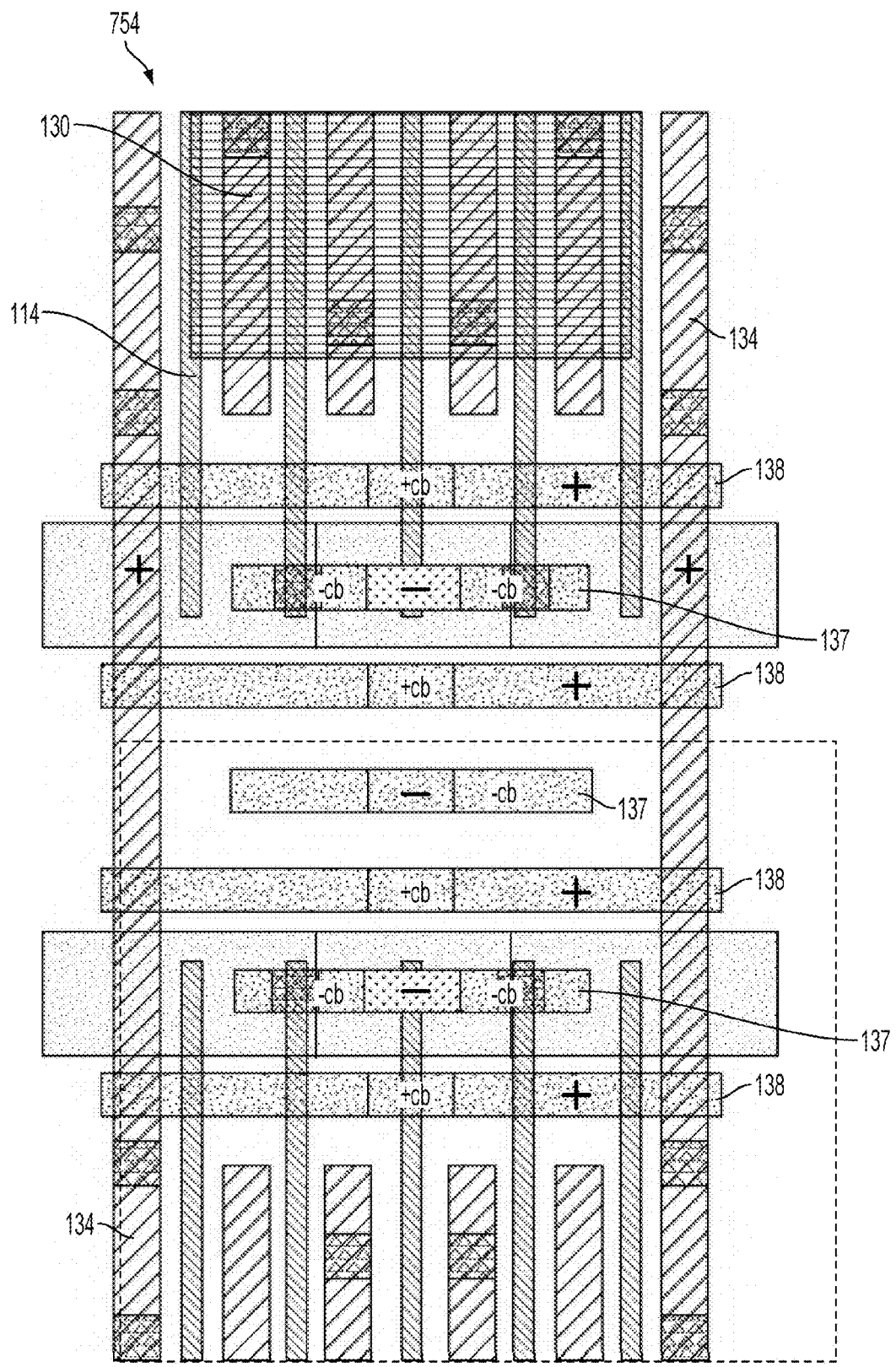

FIG. 7G is a close-up view of the inset area 754. FIG. 7G illustrates that a capacitive structure may lie between the implant regions 106 to use the area of a chip that may be otherwise unused. The gate interconnect 138 is coupled to a plate of the capacitive structure, which may be the same plate as the main poly 114. The other plate of the capacitive structure is coupled to the trench interconnect 130. Again, one or more of the trench interconnect 137 may be surrounded by others ones of the gate interconnect 138 and part of the gate interconnect 134.

Figure 7H:
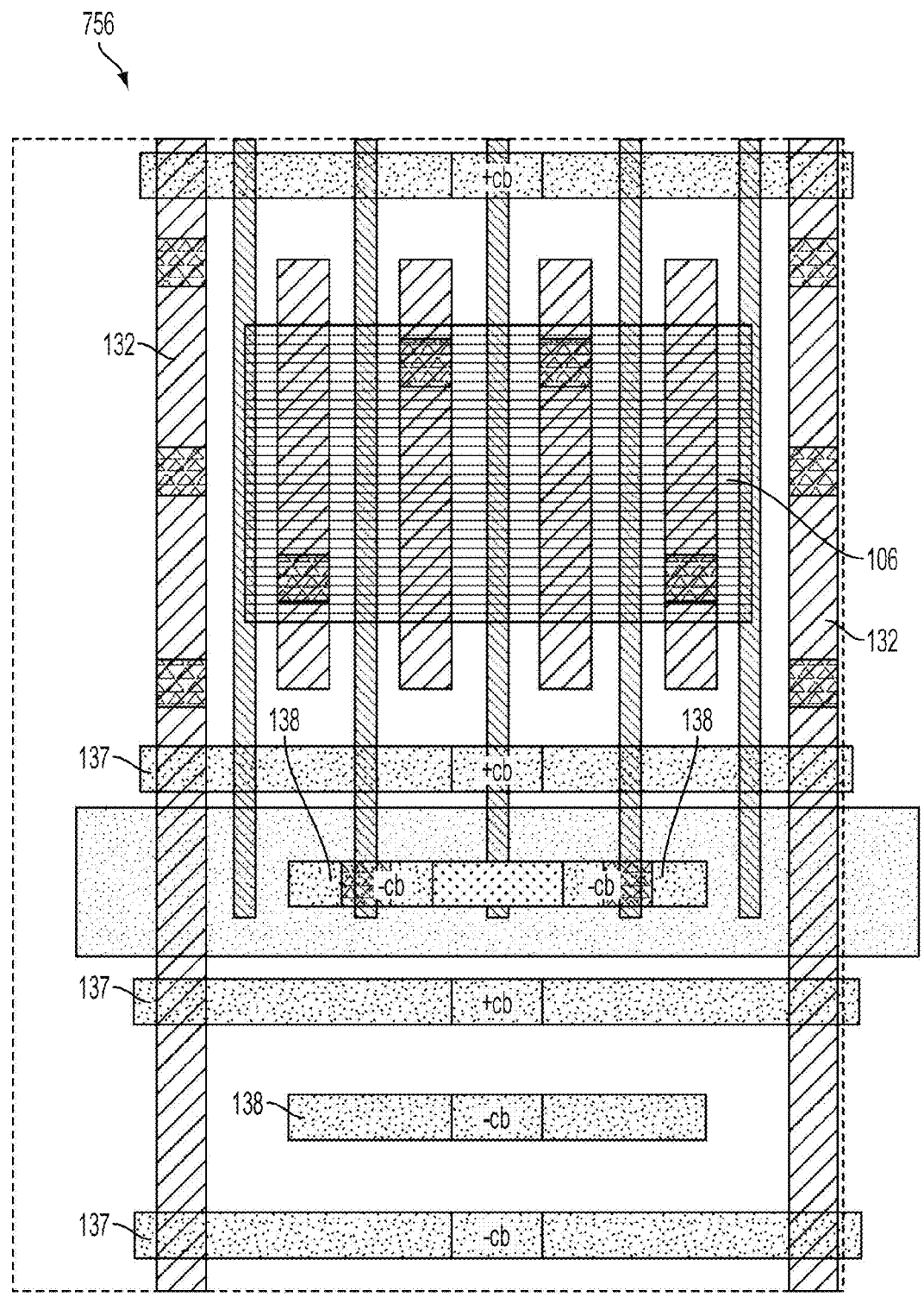

FIG. 7H is a close-up view of the inset area 756, similar to that shown in FIG. 7G. The inset area 756 illustrates the gate interconnect 138 as a negative plate of a capacitive structure, and trench interconnect 137 as the positive plate of a capacitive structure. Because the inset area 756 is near an edge of a cell or other structure, the active area of the implant regions 106 is not proximate to at least some of the capacitive structure shown in the inset area 756. Further, FIG. 7H illustrates that the gate interconnect 138 may be broken up and still surrounded by other interconnects (e.g., 132 and/or 137) to form capacitive structures. The surrounded interconnects (e.g., 138) may be connected to one of the capacitor structure plates using vias or other interconnect layers as desired.

Polysilicon Layer-Interconnect Layer Capacitive Structures

Figure 8A:
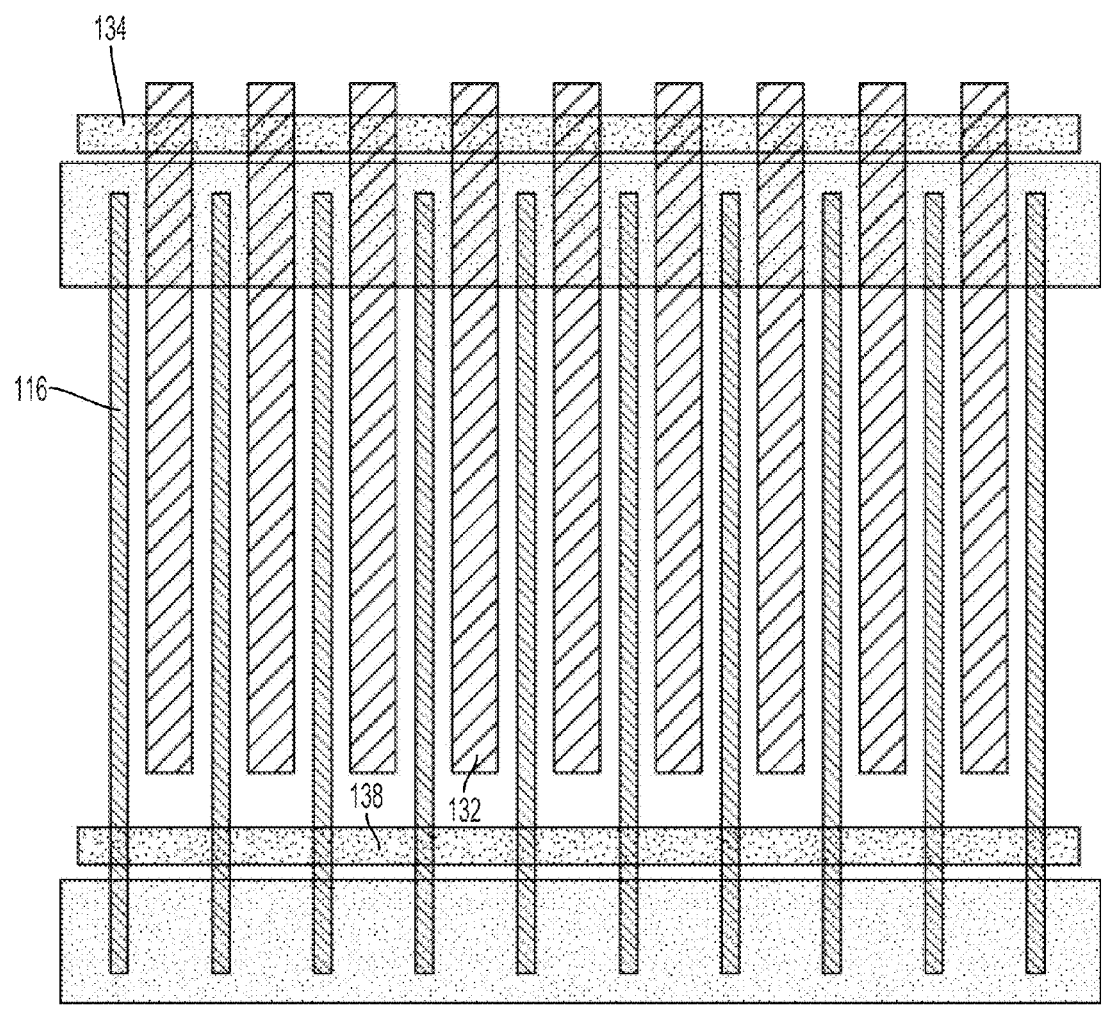
FIGS. 8A-8B illustrate capacitor structures in accordance with further aspects of the present disclosure.

FIG. 8A illustrates a poly layer-interconnect layer capacitor in accordance with an aspect of the present disclosure. Although the gate interconnect layer and the trench interconnect layer may be used as various components of a capacitive structure as described in the present disclosure, the polysilicon layers ("poly") may also be used in combination with one or more of the gate interconnect layer and the trench interconnect layer to create capacitive structures in various aspects of the present disclosure. As shown in FIG. 8A, a gate interconnect 134 may be coupled to one or more ones of the trench interconnect 132. FIG. 8A shows the gate interconnect 134 as being "horizontal" (i.e., across the page), while multiple ones of the trench interconnect 132 are shown as "vertical" (i.e., from top to bottom of the page). Other orientations of the gate interconnect 134 and the trench interconnect 132 are possible within the scope of the present disclosure.

The gate interconnect 134 and the trench interconnect 132 form one "plate" of a capacitive structure. The finger-like structure shown in FIG. 8A is one of many possible capacitive structures for a plate of such a capacitive structure. The dummy poly region 116, which may also have a finger-like structure interleaved with multiple ones of the trench interconnect 132, is coupled to a gate interconnect 138. The dummy poly region 116 layer and gate interconnect 138 form the other plate of the capacitive structure shown in FIG. 8A. In such a structure, the gate interconnect 134 and the trench interconnect 132 may form a positive plate of the capacitive structure, and the dummy poly region 116 and gate interconnect 138 may form a negative plate of the capacitive structure, although the polarities of the plates may be reversed if desired. The capacitor is formed between the dummy poly region 116 and the trench interconnect 132.

Figure 8B:
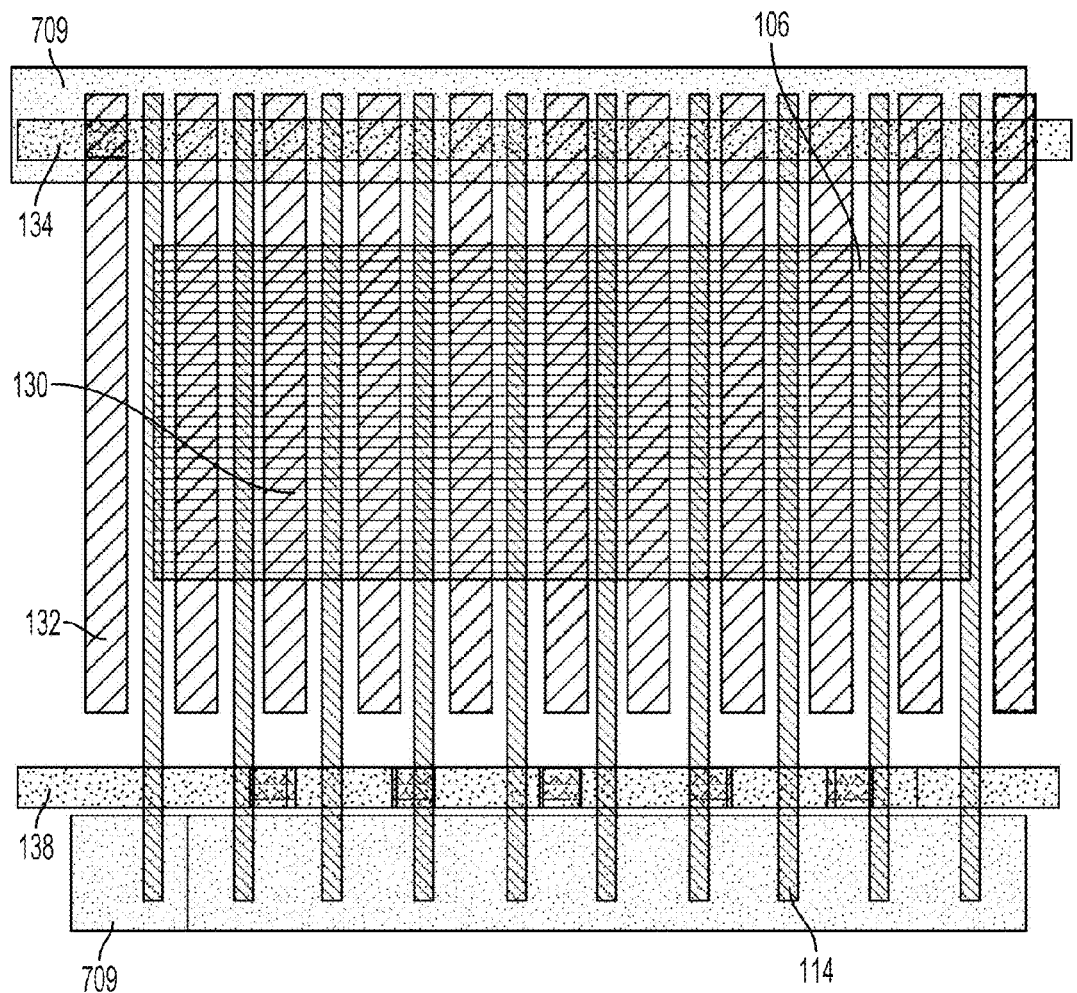

FIG. 8B illustrates a MOS device capacitor and a poly layer-interconnect layer capacitor in accordance with an aspect of the present disclosure. As shown in FIG. 8B, the main poly 114 resides in the region of the implant regions 106, and are coupled to a gate interconnect 138. Although FIG. 8B shows the main poly 114 as being "vertical", (i.e., from top to bottom of the page), other orientations of the main poly 114 are possible within the scope of the present disclosure. The main poly 114 and the gate interconnect 138 may form one plate of a capacitive structure.

The gate interconnect 134 is coupled to the trench interconnect 132, and the trench interconnect 130, and may form another plate of a capacitive structure. In the structure shown in FIG. 8A part of the capacitive structure, that which is formed by the main poly 114 (which may include any dummy poly region 116) and the trench interconnect 130 (which may include the trench interconnect 130), forms a MOS capacitor. The part of the capacitive structure formed by multiple ones of the trench interconnect 132 and any main poly 114 outside of the implant regions 106, however, is a poly layer-interconnect layer capacitive structure. These two portions may be coupled together with the gate interconnect 134 and/or the gate interconnect 138, or may form separate, parallel, or series capacitors as desired. In such a structure, the gate interconnect 138 and the main poly 114 may form a positive plate of the capacitive structure, although the polarities of the plates may be reversed if desired.

Figure 9A:
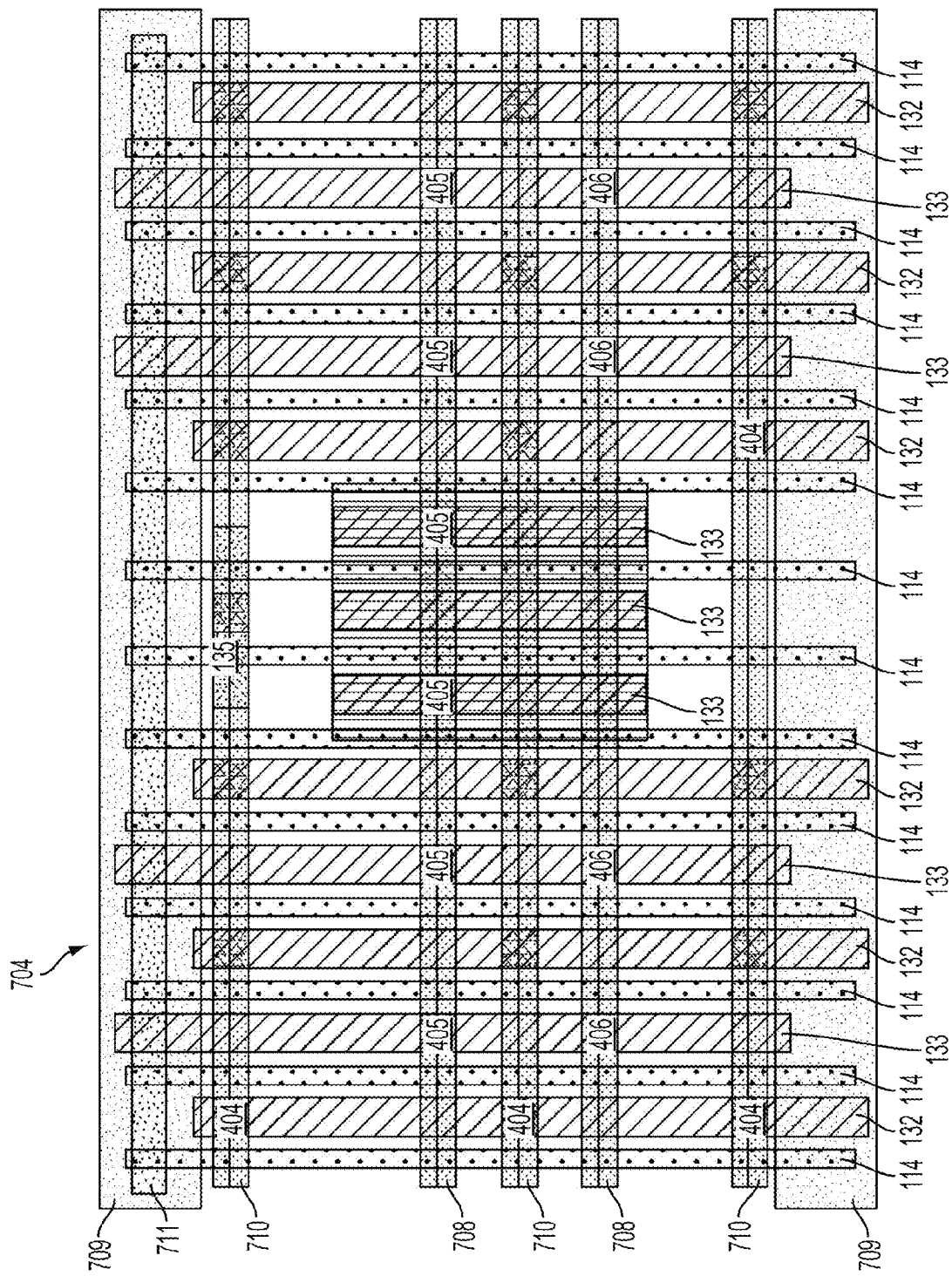
FIGS. 9A and 9B illustrate capacitor structures in accordance with aspects of the present disclosure.
Figure 9B:
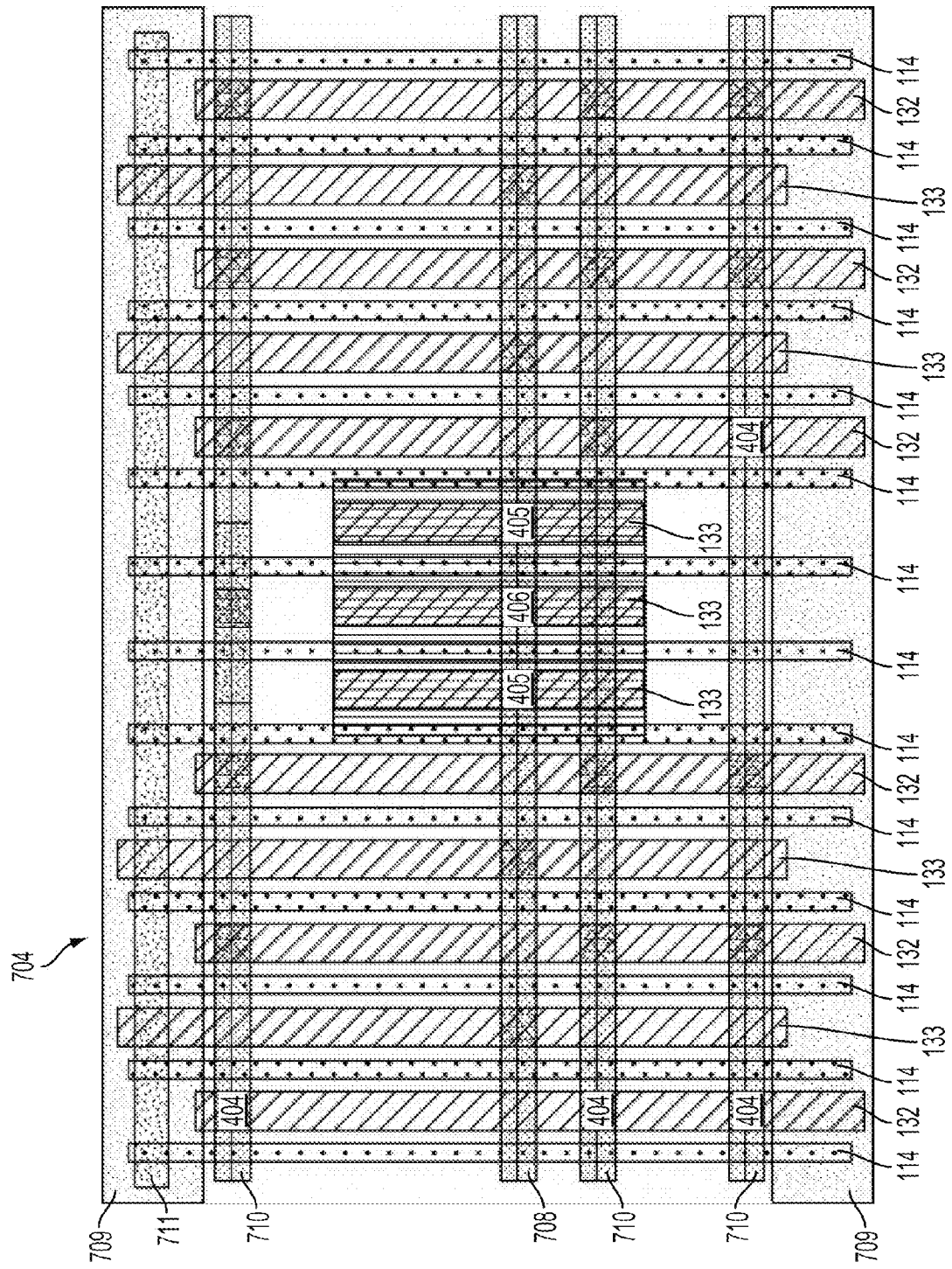

Horizontal Capacitor Structures;

FIGS. 9A and 9B illustrate capacitor structures in accordance with aspects of the present disclosure. FIG. 9A illustrates a trench interconnect 132 coupled to a trench interconnect 133 to provide a capacitor structure 704. In this arrangement, a trunk 711 of interconnect material, which may be a poly interconnect material, couples one or more of the trench interconnect 133 (e.g., a vertical CA interconnect). This part of the structure forms one terminal of the capacitor structure 704. The metal 710 of interconnect material is coupled to other alternative vertical CA (trench interconnect 132) to form the other capacitor terminal of the capacitor structure 704. This capacitor structure creates capacitance between the trench interconnect 132 (positive) to the trench interconnect 133 (negative) or vice versa. The cut poly 709 is shown as cutting multiple ones of the main poly 114. The Via 405 and the via 406 coupled to the same polarity conductive terminal 708 and the trench interconnect 133 (CA interconnect). The Via 405 and the via 406 that are proximate the drain and source of the MOSFET device may be arranged in a zigzag pattern as shown in FIG. 9A (this may be due to the foundry specification. In particular, some foundries prohibits placing the via 405 and the 406 side by side close to each other.

FIG. 9B illustrates similar features to those shown in FIG. 9A; however, the via 405 and the 406 are disposed over the drain and the source of the MOSFET device and shown in a linear horizontal arrangement.

Figure 10:
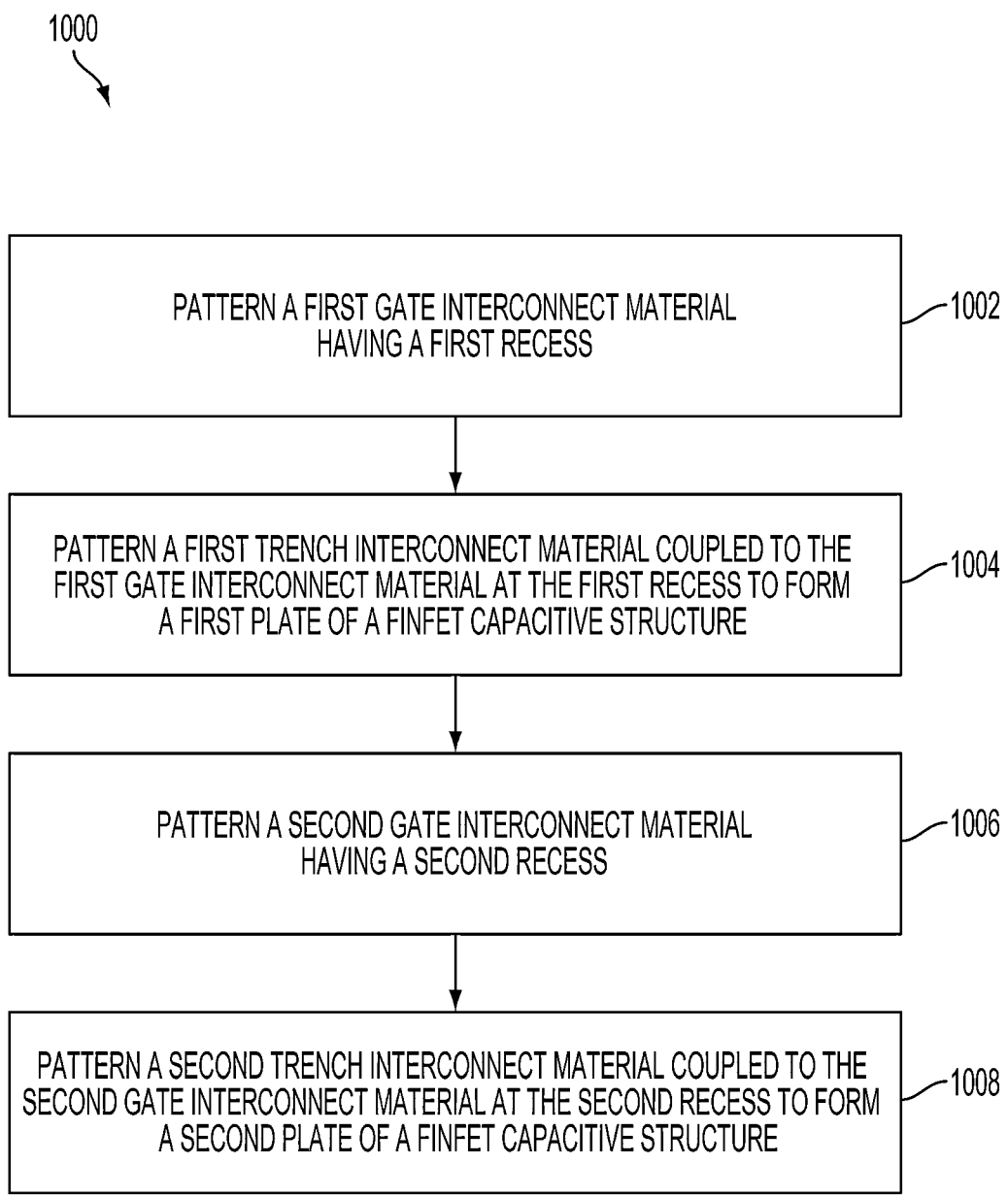
FIG. 10 is a process flow diagram illustrating a method for creating FinFET capacitive structures.

FIG. 10 is a process flow diagram illustrating a method 1000 for creating capacitive structures in a FinFET device. In block 1002, a first gate interconnect material having a first recess is patterned as shown in FIGS. 1, 3, 4, 5, and 6. In block 1004, a first trench interconnect material coupled to the first gate interconnect material at the first recess is patterned to form a first plate of a FinFET capacitive structure for example, as shown in FIGS. 1, 3, 4, 5, and 6. In block 1006, a second gate interconnect material having a second recess is patterned. In block 1008, a second trench interconnect material coupled to the second gate interconnect material at the second recess is patterned to form a second plate of a FinFET capacitive structure, as shown in FIG. 3.

According to a further aspect of the present disclosure, a device including capacitive structures in a FinFET is described. In one configuration, the device includes first means for interconnecting a first gate having a first recess. The first gate interconnecting means may be the gate interconnects (e.g., 134, 136, and/or 138). The device further includes first means for interconnecting a first trench coupled to the first gate interconnecting means at the first recess to form a first plate of a FinFET capacitive structure. The first trench interconnecting means may be the trench interconnect 128, the trench interconnect 130, and/or the trench interconnect 132. The device also includes second means for interconnecting a second gate having a second recess. The second gate interconnecting means may be gate interconnects (e.g., 134, 136, and/or 138). Such a device also includes second means for interconnecting a second trench coupled to the second gate interconnecting means at the second recess to form a second plate of a FinFET capacitive structure. The second trench interconnecting means may be trench interconnects (e.g., 128, 130, and/or 132). In another aspect, the aforementioned means may be any module or any apparatus configured to perform the functions recited by the aforementioned means.

Figure 11:
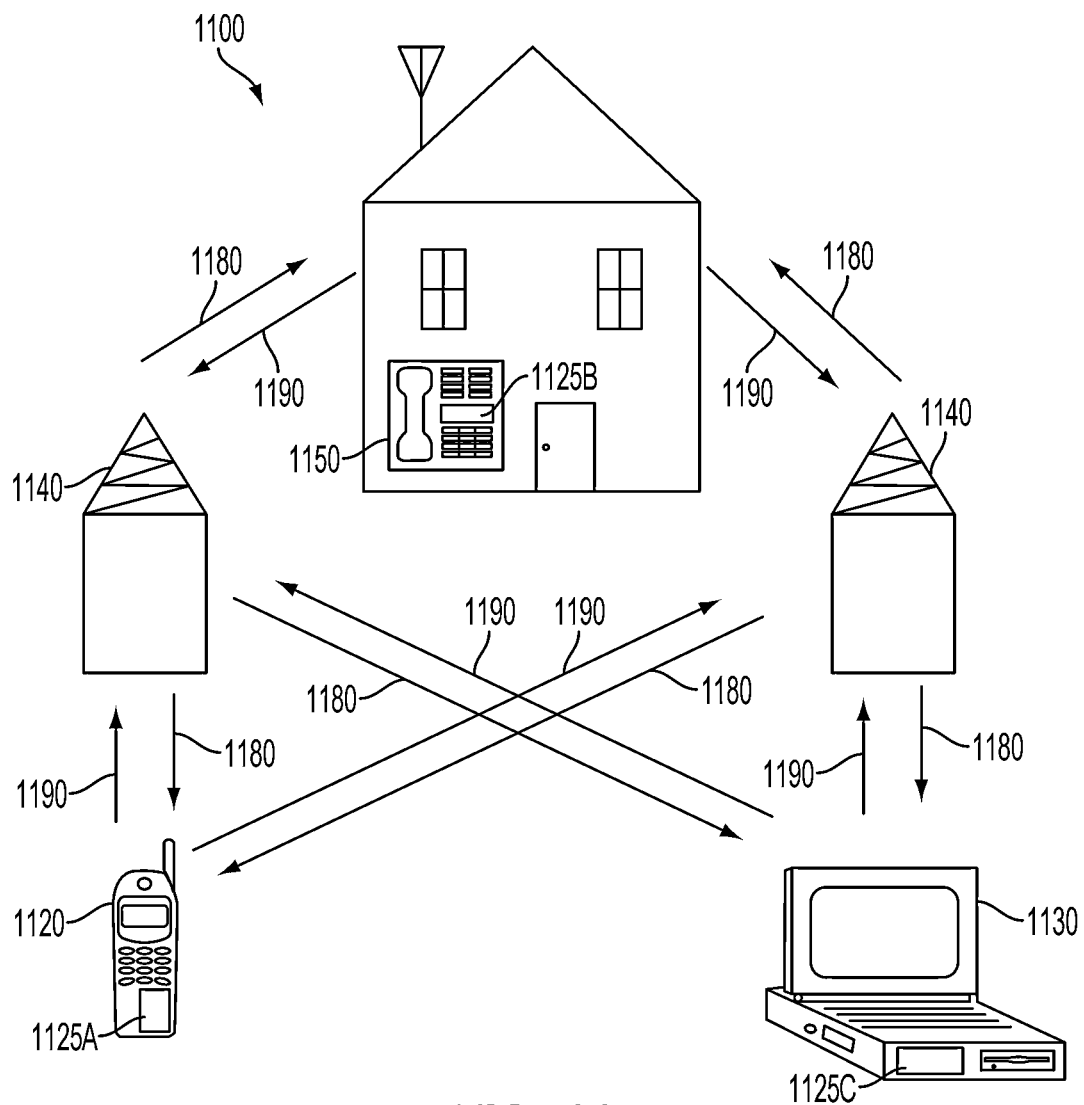
FIG. 11 is a block diagram showing an exemplary wireless communication system in which an aspect of the disclosure may be advantageously employed.

FIG. 11 is a block diagram showing an exemplary wireless communication system 1100 in which an aspect of the disclosure may be advantageously employed. For purposes of illustration, FIG. 11 shows three remote units 1120, 1130, and 1150 and two base stations 1140. It will be recognized that wireless communication systems may have many more remote units and base stations. Remote units 1120, 1130, and 1150 include IC devices 1125A, 1125C, and 1125B that include the disclosed capacitive devices. It will be recognized that other devices may also include the disclosed capacitive structures devices, such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 11 illustrates remote units according to the aspects of the disclosure, the disclosure is not limited to these exemplary illustrated units. Aspects of the disclosure may be suitably employed in many devices, which include the disclosed devices.

Figure 12:
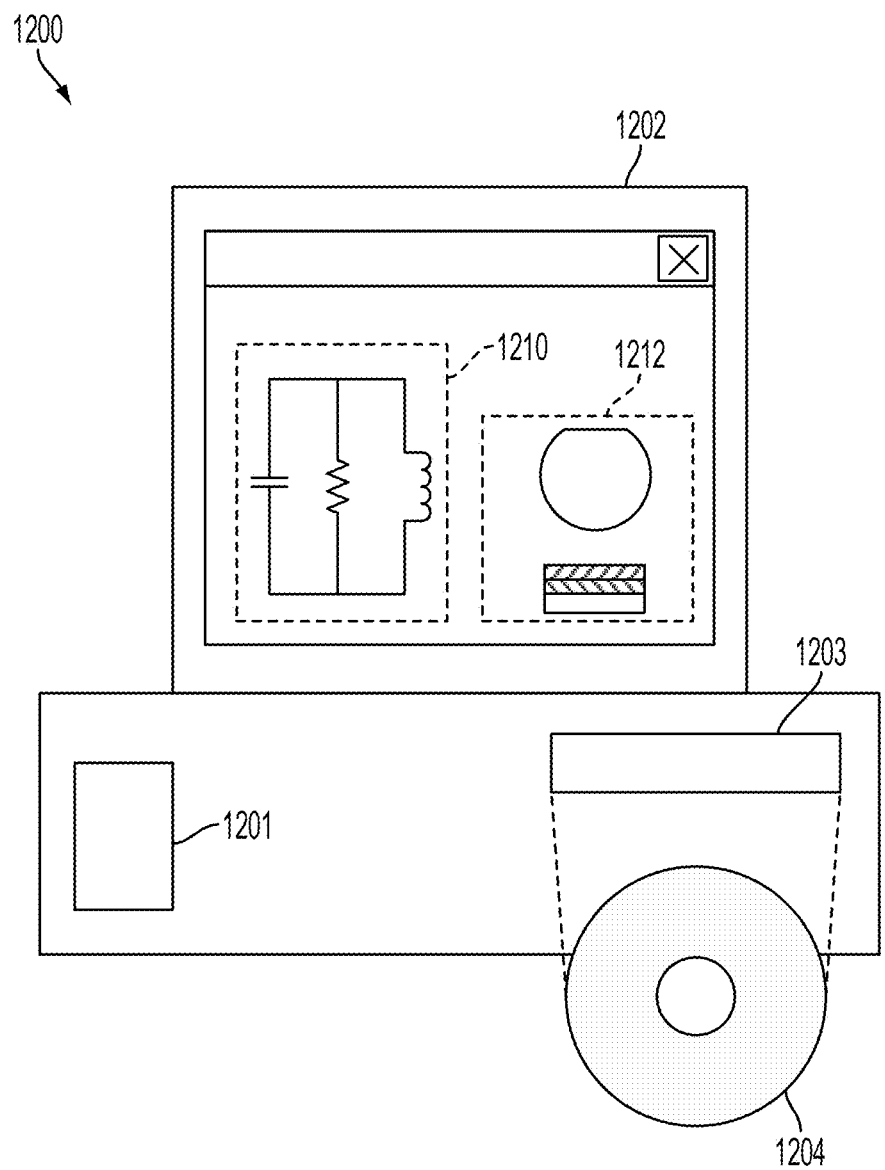
FIG. 12 is a block diagram illustrating a design workstation used for circuit, layout, and logic design of a semiconductor component, such as the capacitive devices disclosed above.

FIG. 12 is a block diagram illustrating a design workstation used for circuit, layout, and logic design of a semiconductor component, such as the capacitive devices disclosed above. A design workstation 1200 includes a hard disk 1201 containing operating system software, support files, and design software such as Cadence or OrCAD. The design workstation 1200 also includes a display 1202 to facilitate design of a circuit 1210 or a semiconductor component 1212 such as a capacitive device in accordance with an aspect of the present disclosure. A storage medium 1204 is provided for tangibly storing the design of the circuit 1210 or the semiconductor component 1212. The design of the circuit 1210 or the semiconductor component 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit 1210 or the semiconductor component 1212 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A capacitor within a FinFET device, comprising:
a first gate interconnect material having a first recess;
a first stacked trench interconnect material coupled to the first gate interconnect material at the first recess to form a first plate of a FinFET capacitive structure;
a second gate interconnect material having a second recess; and
a second stacked trench interconnect material coupled to the second gate interconnect material at the second recess to form a second plate of the FinFET capacitive structure.

2. The capacitor of claim 1, in which the first gate interconnect material, the second gate interconnect material, the first stacked trench interconnect material and the second stacked trench interconnect material are arranged in a ring structure.

3. The capacitor of claim 1, in which the first gate interconnect material, the second gate interconnect material, the first stacked trench interconnect material and the second stacked trench interconnect material are arranged in an interwoven finger structure.

4. The capacitor of claim 1, in which the first gate interconnect material, the second gate interconnect material, the first stacked trench interconnect material and the second stacked trench interconnect material are arranged in an array of striped structures.

5. The capacitor of claim 1, in which a polysilicon region forms at least a portion of the second plate of the FinFET capacitive structure.

6. The capacitor of claim 1, in which the second plate of the FinFET capacitive structure is proximate an active region of the FinFET device.

7. The capacitor of claim 1 integrated into a mobile phone, a set top box, a music player, a video player, an entertainment unit, a navigation device, a computer, a hand-held personal communication systems (PCS) unit, a portable data unit, and/or a fixed location data unit.

8. A device including capacitive structures in a FinFET device, comprising:
first means for interconnecting a first gate having a first recess;

first means for interconnecting to the first gate interconnecting means at the first recess to form a first plate of a FinFET capacitive structure;

second means for interconnecting a second gate having a second recess; and second means for interconnecting to the second gate interconnecting means at the second recess to form a second plate of the FinFET capacitive structure.

9. The device of claim 8 integrated into a mobile phone, a set top box, a music player, a video player, an entertainment unit, a navigation device, a computer, a hand-held personal communication systems (PCS) unit, a portable data unit, and/or a fixed location data unit.

* * * * *